United States Patent
Kurihara et al.

(10) Patent No.: US 8,680,669 B2
(45) Date of Patent: Mar. 25, 2014

(54) ELECTRONIC COMPONENT, ELECTRONIC MODULE, AND METHOD FOR MANUFACTURING THE SAME

(71) Applicant: Canon Kabushiki Kaisha, Tokyo (JP)

(72) Inventors: Yasushi Kurihara, Hiratsuka (JP); Koji Tsuduki, Kawasaki (JP); Hiroaki Kobayashi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/629,416

(22) Filed: Sep. 27, 2012

(65) Prior Publication Data

US 2013/0083493 A1 Apr. 4, 2013

(30) Foreign Application Priority Data

Sep. 30, 2011 (JP) .................. 2011-216774

(51) Int. Cl.
*H01L 23/12* (2006.01)
(52) U.S. Cl.
USPC .... 257/704; 257/729; 257/795; 257/E23.121; 438/118
(58) Field of Classification Search
USPC ........... 257/704, 729, 795, E23.121; 438/118
See application file for complete search history.

(56) References Cited

U.S. PATENT DOCUMENTS

| 5,864,178 A | 1/1999 | Yamada |
| 7,262,511 B2 * | 8/2007 | Osako et al. .................. 257/783 |
| 2006/0043544 A1 | 3/2006 | Tsukamoto |

FOREIGN PATENT DOCUMENTS

| JP | 5-175474 A | 7/1993 |
| JP | 2000-191751 A | 7/2000 |

* cited by examiner

*Primary Examiner* — Tu-Tu Ho
(74) *Attorney, Agent, or Firm* — Canon U.S.A., Inc., IP Division

(57) ABSTRACT

An electronic component includes a unit including an electronic device; and an opposite member opposing the electronic device, wherein the unit and the opposite member are bonded together with an adhering member disposed between the unit and the opposite member and having light-cured resin and inorganic particles dispersed in the light-cured resin; and wherein in a particle-diameter distribution of the inorganic particles by volume, a particle diameter having a cumulative value of distribution of 50 is 0.5 μm or more, and a particle diameter having a cumulative value of distribution of 90% is 5.0 μm or less.

20 Claims, 8 Drawing Sheets

US 8,680,669 B2

ELECTRONIC COMPONENT, ELECTRONIC MODULE, AND METHOD FOR MANUFACTURING THE SAME

BACKGROUND

1. Technical Field

The disclosure relates to an electronic-device packaging technique and mounting technique.

2. Description of the Related Art

An electronic device, such as a photoelectric conversion element, can be packaged into an electronic component, and the electronic component can be installed in an electronic module.

Japanese Patent Laid-Open No. 5-175474 discloses a solid-state image pickup device in which a translucent cap is fixed to an envelope with a bonding member. Here, the boding member is formed of an ultraviolet curing adhesive containing glass beads having a diameter of about 0.5 to 10 μm.

SUMMARY

According to a first aspect of the present disclosure, an electronic component comprises: a unit including an electronic device; and an opposite member opposing the electronic device, wherein the unit and the opposite member are bonded together with an adhering member disposed between the unit and the opposite member, the adhering member having light-cured resin and inorganic particles dispersed in the light-cured resin; and wherein in a particle-diameter distribution of the inorganic particles by volume, the following conditions (a), (b), (c) and (d) are satisfied:

$D_{50} \geq 0.5$ μm  (a)

$D_{90} \leq 5.0$ μm  (b)

$D_{90}/T \leq 0.4$  (c)

5 μm ≤ T ≤ 40 μm  (d)

where $D_{50}$ is a particle diameter having a cumulative value of distribution of 50%, $D_{90}$ is a particle diameter having a cumulative value of distribution of 90%, and T is the thickness of the adhering member.

According to a second aspect of the present disclosure, a method for manufacturing an electronic component including an electronic device and an opposite member opposing the electronic device is provided, the method comprising: interposing an adhesive containing a light-curable liquid composition and inorganic particles dispersed in the liquid composition (1) between at least part of a fixing member for fixing the electronic device and the opposite member to each other and the opposite member or (2) between the electronic device and the opposite member; and forming an adhering member by curing the adhesive with an exposure of the adhesive to light via the opposite member, wherein in a particle-diameter distribution of the inorganic particles by volume, the following conditions (a), (b), (c), and (d) are satisfied:

$D_{50} \geq 0.5$ μm  (a)

$D_{90} \leq 5.0$ μm  (b)

$D_{90}/T \leq 0.4$  (c)

5 μm ≤ T ≤ 40 μm  (d)

where $D_{50}$ is a particle diameter having a cumulative value of distribution of 50%, $D_{90}$ is a particle diameter having a cumulative value of distribution of 90%, and T is the thickness of the adhering member.

DESCRIPTION OF THE EMBODIMENTS

For example, in electronic module including a solid-state image pickup device, as in Japanese Patent Laid-Open No. 5-175474, a large number of white spots are sometimes observed in a bonding portion formed of an ultraviolet curable adhesive. The inventors have found that delamination between the resin and the glass beads has occurred at locations corresponding to the white spots and named this delamination as "spot delamination". This spot delamination can decrease the reliability of the electronic component. According to some embodiments, an electronic component in which the occurrence of "spot delamination" is prevented can be provided.

An electronic component according to a first aspect of the present embodiment includes a unit including an electronic device and an opposite member opposing the electronic device. The unit and the opposite member are bonded together with an adhering member disposed between the unit and the opposite member and having light-cured resin and inorganic particles dispersed in the light-cured resin. Advantageous conditions for the particle diameter of the inorganic particles and the thickness of the adhering member will be described in the following embodiments.

A method for manufacturing an electronic component according to a second aspect of the present embodiment comprises interposing an adhesive containing a light-curable liquid composition and inorganic particles dispersed in the liquid composition and comprises forming an adhering member by curing the adhesive with an exposure of the adhesive to light via the opposite member. The adhesive is interposed between at least part of a fixing member for fixing the electronic device and the opposite member to each other and the opposite member or is interposed between the electronic device and the opposite member. Advantageous conditions for the particle diameter of the inorganic particles and the thickness of the adhering member will be described in the following embodiments. Further features of the present disclosure will become apparent from the following description of exemplary embodiments with reference to the attached drawings.

Figure 1A:
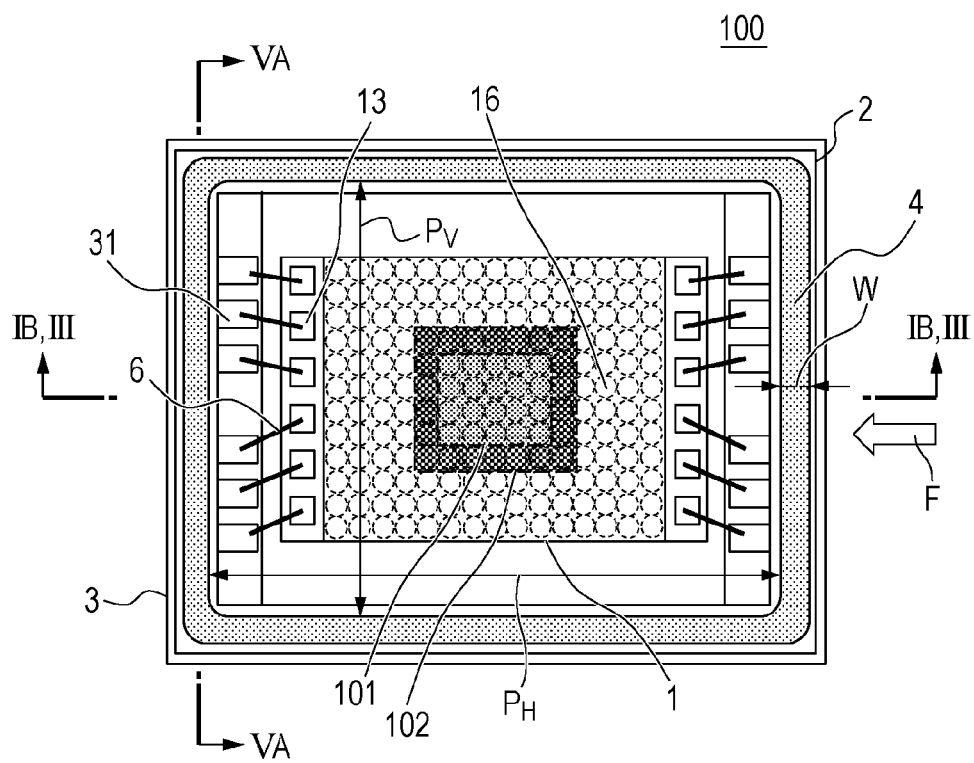
FIG. 1A is a schematic plan view of an example of an electronic component according to a first embodiment.
Figure 1B:
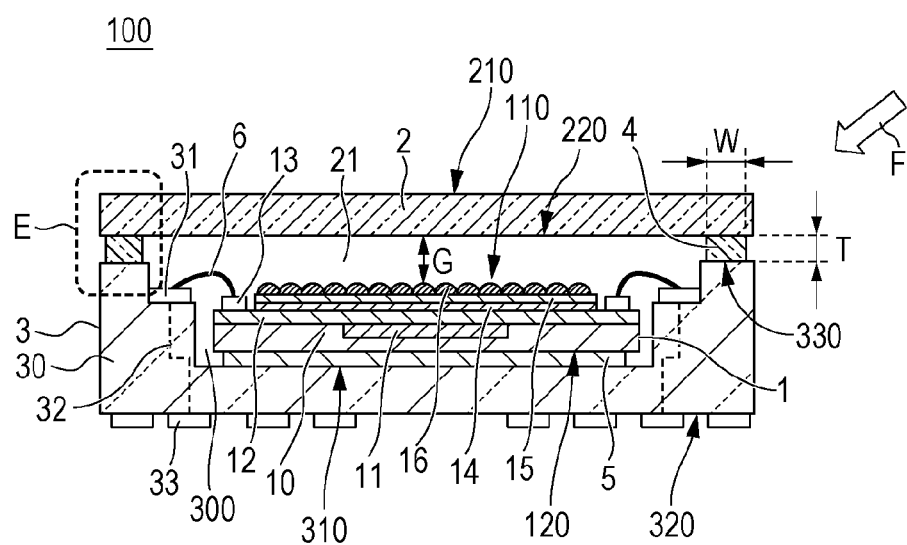
FIG. 1B is a schematic cross-sectional view of the electronic component according to the first embodiment.

First, referring to FIGS. 1A and 1B, an example of an electronic component 100 according to a first embodiment will be described. FIG. 1A is a schematic plan view of the electronic component 100, and FIG. 1B is a schematic cross-sectional view of the electronic component 100 taken along line IB-IB in FIG. 1A. The electronic component 100 includes an electronic device 1, an opposite member 2, and a fixing member 3.

The electronic device 1 of this example is a photoelectric conversion element, such as a CMOS sensor and a CCD sensor, which can be used as at least any of an image pickup device, a ranging device (also referred to as a focus detection device), and a photometric device. Although the kind of the electronic device 1 is not limited to the photoelectric conversion element, this embodiment is suitable for an electronic device that uses light. Examples of the electronic device that uses light include not only a photo detector, such as the photoelectric conversion element, but also light-emitting devices, such as a light-emitting diode and a laser diode. Other examples are light reflecting devices, such as a reflection liquid-crystal panel and a digital mirror device (DMD), and light transmitting devices, such as a transmission liquid-crystal panel. These light emitting devices, light reflecting devices, and light transmitting devices can be used as display devices. Another example of the electronic device that uses light includes an erasable programmable read-only memory (EPROM).

The opposite member 2 is disposed opposite the electronic device 1. Since the opposite member 2 has sufficient rigidity, the electronic device 1 is protected by the opposite member 2 from adhesion of foreign substances and damage. The opposite member 2 is distance G apart from the electronic device 1. Specifically, the distance G is the distance between the front surface 110 of the electronic device 1 and the lower surface 220 of the opposite member 2. The lower surface 220 of the opposite member 2 is one of the two main surfaces of the opposite member 2 opposing the electronic device 1, and the upper surface 210 of the opposite member 2 is the other of the two main surfaces opposite to the opposing surface, that is, a non-opposing surface. Between the electronic device 1 and the opposite member 2, a space 21 is provided which is filled with gas, such as air or inert gas, and which is in contact with the electronic device 1 and the opposite member 2. The opposite member 2 has sufficiently high light transmittance at least for the wavelength of light for use in exposure (exposure light) when forming an adhering member 4, that is, an exposure light wavelength, which will be described later in detail. In the case where the electronic device 1 uses light, the opposite member 2 is a transparent member having sufficiently high light transmittance also for the wavelength of light used.

For example, the opposite member 2 is formed of an inorganic material, such as glass and quartz, or an organic material, such as resin. The transparent opposite member 2, typically, has a thickness of 0.1 mm or more and 1 mm or less. Since the electronic device 1 of this example is a photoelectric conversion element, the opposite member 2 has sufficiently high light transmittance also for the wavelength of light received by the photoelectric conversion element to generate signal carriers (signal light). Typical light used by the photoelectric conversion element has a wavelength of 0.4 µm or more and 0.8 µm or less. Although the opposite member 2 of this example has a planer shape in which the entire upper surface 210 is parallel to the entire lower surface 220, it may be shaped like a lens, such as a convex lens.

The electronic device 1 is bonded to the fixing member 3 with the bonding member 5. In this example, although the bonding member 5 is disposed between the electronic device 1 and the fixing member 3, the bonding member 5 may be disposed so as to cover the edge of the electronic device 1. The bonding member 5 may be bonding paste or bonding tape. Most of the fixing member 3 is constituted by a substrate 30. Examples of the material of the substrate 30 include ceramics, plastics, metal, and glass epoxy. In the case where the electronic device 1 is a photoelectric conversion element that receives visible light, the substrate 30 may be blue, violet, or black.

The fixing member 3 includes a plurality of inner terminals 31 and a plurality of external terminals 33 that are electrically connected to the individual inner terminals 31 via inner wires 32. The electronic device 1 has a plurality of electrodes 13 for inputting or outputting electrical signals. The electrodes 13 and the inner terminals 31 are electrically connected together via connecting members 6. In this example, the connecting members 6 are bonding wires, and the method of connecting the electrodes 13 and the inner terminals 31 is wire bonding. Alternatively, the electrodes 13 and the inner terminals 31 may be connected by flip-chip bonding.

In this example, the fixing member 3 has a depression 300 constituted by an inner surface 310 thereof. The depression 300 accommodates the electronic device 1. The back surface 120 of the electronic device 1 is bonded to the bottom of the depression 300 with the bonding member 5. The sides of the depression 300 face the sides of the electronic device 1, with a gap therebetween. The inner terminals 31 are disposed on the inner surface 310 of the fixing member 3 so as to be exposed to the depression 300. The inner surface 310 and the outer surface 320 of the fixing member 3 individually continue to an upper surface 330. The external terminals 33 are exposed from the outer surface 320 of the fixing member 3. The external terminals 33 of this embodiment are provided at least in the region of orthogonal projection from at least one of the electronic device 1 and the opposite member 2. Specifically, the external terminals 33 are provided in two dimensions on the back of the bottom of the depression 300 of the substrate 30. As shown in FIG. 1B, part of the external terminals 33 are located out of the region of orthogonal projection from the electronic device 1 and in the region of orthogonal projection from the opposite member 2. The remaining of the external terminals 33 are located in the region of orthogonal projection from the electronic device 1 and out of the region of orthogonal projection from the opposite member 2.

Although the external terminals 33 of this example are each planar in shape and have a so-called land grid array (LGA) structure, they may have a pin grid array (PGA) structure in which pins are used as the external terminals 33. As another alternative, the external terminals 33 may have a ball grid array (BGA) structure in which solder balls used as electrically conducting members 7, described later, are firmly fixed to the external terminals 33 with the LGA structure.

The adhering member 4 is disposed between the opposite member 2 and the fixing member 3. The opposite member 2 is bonded to the fixing member 3 with the adhering member 4. Specifically, the adhering member 4 is disposed between the lower surface 220 of the opposite member 2 and the upper surface 330 of the fixing member 3, the periphery of the lower surface 220 of the opposite member 2 and the adhering member 4 are bonded together, and the upper surface 330 of the fixing member 3 and the adhering member 4 are bonded together. That is, the lower surface 220 of the opposite member 2 serves as the adhering surface of the opposite member 2 to the adhering member 4, and the upper surface 330 of the fixing member 3 serves as the bonding surface of the fixing member 3 to the adhering member 4. The opposite member 2 is disposed at a distance corresponding to the thickness T of the adhering member 4 from the fixing member 3. In detail, the distance between the upper surface 330 of the fixing member 3 and the lower surface 220 of the opposite member 2 is equal to the thickness T of the adhering member 4. The adhesion of the opposite member and the fixing member 3 improves as the width W of the adhering member 4 increases. With the above configuration, the fixing member 3 fixes the electronic device 1 and the opposite member 2 to each other.

Figure 2A:
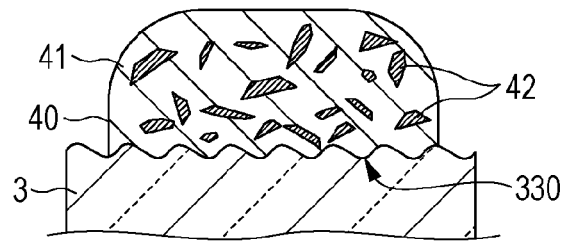
FIGS. 2A to 2D are schematic diagrams for explaining an adhesive and an adhering member.
Figure 2B:
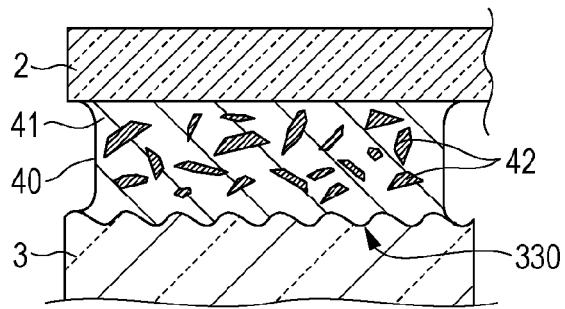
Figure 2C:
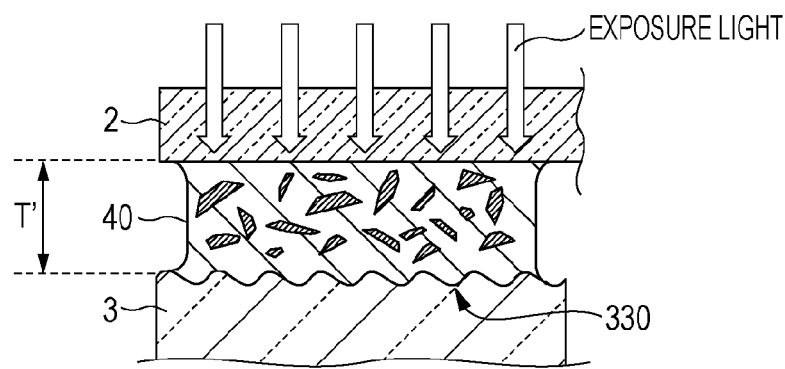
Figure 2D:
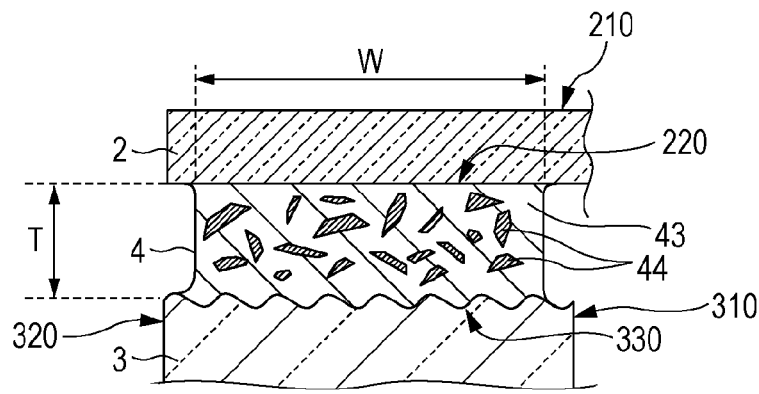

The adhering member 4 will be described in detail with reference to FIG. 2D, which is an enlarged view of the portion enclosed by line E in FIG. 1B. The adhering member 4 contains solid light-cured resin 43 and a large number of inorganic particles 44, which are solids dispersed in the light-cured resin 43. The inorganic particles 44 function as fillers in the adhering member 4.

In a particle-diameter distribution of the inorganic particles 44 by volume, $D_{50}$ is 0.5 μm or more (Condition (a) $D_{50} \geq 0.5$ μm), where $D_{50}$ is a particle diameter having a cumulative value of distribution of 50%. In a particle-diameter distribution of the inorganic particles 44 by volume, $D_{90}$ is 5.0 μm or less (Condition (b) $D_{90} \leq 5.0$ μm), where $D_{90}$ is a particle diameter having a cumulative value of distribution of 90%. The ratio of $D_{90}$ to T, $D_{90}/T$, is 0.4 or less (Condition (c) $D_{90}/T \leq 0.4$). The thickness T of the adhering member 4 is 5 μm or more and 40 μm or less (Condition (d) 5.0 μm $\leq T \leq$ 40 μm). Satisfying these conditions (a), (b), (c), and (d) by the adhering member 4 allows the "spot delamination" of the adhering member 4 to be prevented. The spot delamination refers to a state in which gaps 45 are generated between the light-cured resin 43 and the inorganic particles 44, as shown in FIG. 8B, to be described later in detail. Evaluation of the spot delamination can be performed, as a reference, on a region having a length equal to the width W of the adhering member 4 in the lengthwise direction perpendicular to the widthwise direction of the adhering member 4, that is, a substantially square evaluation region W by W in size. The state in which spot delamination is prevented is a state in which ubiquitously distributed spot delamination is not present in the evaluation region. Note that a state in which gaps are generated in the vicinity of the adhering surfaces (the lower surface 220 and the upper surface 330), for example, between the opposite member 2 and the light-cured resin 43 of the adhering member 4 and between the fixing member 3 and the light-cured resin 43 of the adhering member 4 is referred to as "area delamination" and is distinguished from the spot delamination. The spot delamination is also distinguished from bubbles that can be generated in the light-cured resin 43.

In the particle-diameter distribution of the inorganic particles 44 by volume, it may be the case that $D_{10}$ is 0.5 μm or more (Condition (e) $D_{10} \geq 0.5$ μm), where $D_{10}$ is a particle diameter having a cumulative value of distribution of 10%. It may also be the case that $D_{50}$ is 0.9 μm or more and 1.8 μm or less (Condition (f) 0.9 μm $\leq D_{50} \leq$ 1.8 μm), and that $D_{90}$ be 1.8 μm or more and 3.5 μm or less (Condition (g) 1.8 μm $\leq D_{90} \leq$ 3.5 μm). In the particle-diameter distribution of the inorganic particles 44 by volume, it may also be the case that $D_{38}$ is 10 μm or less (Condition (h) $D_{38} \leq 10$ μm), where $D_{38}$ is a particle diameter having a cumulative value of distribution of 99.7%. In the particle-diameter distribution of the inorganic particles 44 by volume, it may be the case that $D_{MAX}$ is 15 μm or less (Condition (i) $D_{MAX} \leq 15$ μm), where $D_{MAX}$ is a particle diameter having a cumulative value of distribution of 100%. Satisfying at least any of these conditions (e), (f), (g), (h), and (i) allows the "spot delamination" of the adhering member 4 to be further prevented. The more conditions among the conditions (e), (f), (g), (h), and (i) are satisfied, the more "pot delamination" can be prevented.

The particle diameters of the inorganic particles 44 are sphere equivalent diameters that are given using a laser diffraction method defined in Japanese Industrial Standard, JIS Z8825-1. The cumulative value of distribution is given by cumulating particle diameters from a smaller particle diameter. That is, the fact that $D_{90}$ is 5.0 μm or less means that particles whose diameters are 5.0 μm or less account for 90% of the total volume of all the particles. In the case where the inorganic particles 44 each have the same density, the particle-diameter distribution by volume and the particle-diameter distribution based on weight may be the same. That is, the fact that $D_{90}$ is 5.0 μm or less means that only particles whose particle diameters are 5.0 μm or less constitute 90% of the total weight of the particles. Particle diameter $D_{50}$ is also referred to as a median diameter, and $D_{MAX}$ is equal to the maximum particle diameter. Typically, the particle-diameter distribution of the inorganic particles 44 is a normal distribution, in which the average particle diameter $D_{AV}$ and the most frequent value $D_{PEAK}$ of the particle diameters are larger than $D_{25}$ and smaller than $D_{75}$, where $D_{25}$ is a particle diameter having a cumulative value of distribution of 25%, and $D_{75}$ is a particle diameter having a cumulative value of distribution of 75%. The particle diameters of the inorganic particles 44 in the adhering member 4 can be measured, for example, by extracting the inorganic particles 44 from the light-cured resin 43 by dissolving the light-cured resin 43 with a chemical solution. In this embodiment, if the measurements of the particle diameters are less than 10.00 μm, the second decimal place is rounded off, and if the measurements of the particle diameters are 10.00 μm or more, the first decimal place is rounded off. For the thickness T of the adhering member 4, the first decimal place is rounded off.

Examples of the material of the inorganic particles 44 include metal oxide particles, such as alumina, antimony oxide, and ferrite, silicate particles, such as talc, silica, mica, kaolin, and zeolite, barium sulfate particles, and calcium carbonate particles. The kind of the material of the inorganic particles 44 may be one or more. Although the shape of the inorganic particles 44 may be spherical, a flaky shape as shown in FIG. 2D provides this embodiment with a particularly great advantage. Typically, such flaky inorganic particles 44 can be obtained by pulverizing a base material. However, it is not essential that the inorganic particles 44 are obtained through pulverization; the inorganic particles 44 having the same shape as that obtained by pulverizing the base material can be regarded to be flaky.

The adhering member 4 of this example has a frame shape enclosing the space 21. As a result, the opposite member 2 and the fixing member 3 are airtightly sealed by the adhering member 4 to form an airtight container. That is, the space 21 in this embodiment is an airtight space. Since the electronic device 1 is located in the airtight container, intrusion of moisture into the space 21 from the outside of the electronic component 100 can be prevented, so that degradation in the performance of the electronic device 1 can be prevented. Furthermore, adhesion of foreign substances to the front surface 110 of the electronic device 1 and the lower surface 220 of the opposite member 2 can be prevented.

The spot delamination may be prevented over the entire periphery of the frame-shaped adhering member 4. In this embodiment, the inner periphery and the outer periphery of the adhering member 4 are substantially rectangular. As shown in FIG. 1A, the inner periphery of the adhering member 4 has a longitudinal length of $P_V$ and a lateral length of $P_H$, and the entire length of the inner periphery is P ($P=2(P_V+P_H)$). Accordingly, it may be the case that no ubiquitously distributed spot delamination is present in all of the 4×(P/W) evaluation regions of the adhering member 4.

In the case where the adhering member 4 has a frame shape, this embodiment offers a great advantage if the area S1 of the contact surface of the lower surface 220 of the opposite member 2 with the space 21 (the portion inside the adhering surface) is larger than the area S4 of the adhering surface of the lower surface 220 of the opposite member 2 with the adhering member 4. If S1 is twice or more as large as S4, a noticeable advantage is offered, and if S1 is five times or more, a more noticeable advantage is offered. This example is set so that the area S1 can be approximated to $P_V \times P_H$, the area S4 can be approximated to $2W(P_V+P_H+2W)$, and $P_V \times P_H > 2W(P_V+P_H+2W)$ can be satisfied. The volume of the space 21 can be approximated to $G \times P_V \times P_H$.

The smaller the thickness T of the adhering member 4 is, and the larger the width W of the adhering member 4 is, the airtightness of the electronic component 100 increases. Therefore, it may be the case that the width W of the adhering member 4 is larger than the thickness T (W>T), such as that $W \geq 10 \times T$ is satisfied in the viewpoint of increasing the airtightness. If the airtightness of the electronic component 100 is not required, the adhering member 4 need not enclose the space 21; the adhering member 4 may either be provided only at the four corners of the upper surface 330 and the opposite member 2 or be provided only between two sides of the upper surface 330 and two sides of the opposite member 2. For example, even if the adhering member 4 does not completely enclose the space 21 and having a slight gap, or if the opposite member 2 or the fixing member 3 has a communication hole to the outside, the space 21 can be referred to as an airtight space provided that its conductance is sufficiently small. Specifically, if the temperature of the space 21 becomes higher than a normal temperature (20° C.) after the adhering member 4 is formed, the space 21 can be referred to as an airtight space provided that the pressure in the space 21 (internal pressure) increases 10% or more. The time after the adhering member 4 is formed is at least one of the time when the electronic component 100 is manufactured, the time when the electronic module, to be described later, is manufactured, and the time when it is used. To improve the adhesion of the adhering member 4, according to one aspect, $W \geq 250$ μm is satisfied, and $W \geq 500$ μm may even be satisfied, irrespective of the thickness T. Although the upper limit of the width W of the adhering member 4 is not particularly limited, it may be the case that the width W is 5,000 μm or less to prevent an increase in size of the electronic component 100.

To prevent the opposite member 2 from coming into contact with the electronic device 1 to damage the electronic device 1, according to one aspect, the distance G between the electronic device 1 and the opposite member 2 is larger than the thickness T of the adhering member 4 (G>T), and $G \geq 5 \times T$ may even be satisfied. In this example, although the lower surface 220 of the opposite member 2 is flat, G>T holds because the upper surface 330 of the fixing member 3 is located closer to the opposite member 2 than the front surface 110 of the electronic device 1, as shown in FIG. 1B. Furthermore, in this embodiment, as shown in FIG. 2D, the upper surface 330 of the fixing member 3, which is the adhering surface to the adhering member 4, is rougher than the lower surface 220 of the opposite member 2, which is the adhering surface to the adhering member 4. This can improve the adhesion between the opposite member 2 and the fixing member 3.

A photoelectric conversion element, which is a typical example of the electronic device 1, will be described in detail. The electronic device 1 has a semiconductor substrate 10, on which a wiring structure 12, a protective layer 14, a color filter layer 15, and a microlens layer 16 are stacked in this order. The front surface 110 of the electronic device 1 is constituted by the microlens layer 16. The back surface 120 of the electronic device 1 is constituted by the semiconductor substrate 10. The wiring structure 12 can be constructed by a plurality of wiring layers (not shown) formed mainly of aluminum or copper and a plurality of interlayer insulating layers (not shown) mainly formed of silicon oxide or silicon nitride.

The semiconductor substrate 10 accommodates a photoelectric conversion unit 11 in which a plurality of photodiodes are arrayed. In the case where the photoelectric conversion element is an image pickup device, the photodiodes can constitute pixels. The region of orthogonal projection of the photoelectric conversion unit 11 is the photoelectric conversion region of the photoelectric conversion element. The photoelectric conversion region can include a pixel circuit that generates electrical signals from signal carriers generated from the photodiodes. The photoelectric conversion region includes at least a light-receiving region 101, and in this example, further includes a light-shield region 102. The light-receiving region 101 of the photoelectric conversion unit 11 receives light through the microlens layer 16, the color filter layer 15, the protective layer 14, and the interlayer insulating layers. The photodiodes in the light-receiving region 101 function as effective pixels. Since the photodiodes in the light-shield region 102 are shielded from light by a shield layer (not shown), the photodiodes in the light-shield region 102 function as optical black pixels (OB pixels). A peripheral circuit region 103 between the photoelectric conversion region and the outer periphery thereof is provided with a driving circuit for driving the photoelectric conversion unit 11, a signal processing circuit for processing electrical signals obtained by the photoelectric conversion unit 11, and so on. The electrodes 13 for receiving signals input to the driving circuit and transmitting signals output from the signal processing circuit from/to the outside are provided in the peripheral circuit region 103. Here, an example in which the wiring structure 12 is disposed between the front surface 110 and the semiconductor substrate 10 is shown. As an alternative, the wiring structure 12 may be disposed opposite the front surface 110 (at the back surface 120 side) with respect to the semiconductor substrate 10. In this case, the front surface 110 of the electronic device 1 may be constituted by the microlens layer 16, and the back surface 120 may be constituted by a support substrate bonded to the wiring structure 12 and different from the semiconductor substrate 10. As another alternative, the substantially entire surface of the front surface 110 may be constituted by the photoelectric conversion region, and the peripheral circuit region may be disposed on another semiconductor substrate opposing the semiconductor substrate 10.

In the case where the electronic device 1 is a photoelectric conversion element, as described above, if the distance between the opposite member 2 and the light-receiving region 101 is short, adhesion of foreign substances to the upper surface or the lower surface of the opposite member 2 would cause the foreign substances to be clearly viewed on the image. To prevent it, it may be the case that the distance G between the lower surface 220 of the opposite member 2 and the light-receiving region 101 is 200 µm or more. Furthermore, it may be the case that the distance between the upper surface 210 of the opposite member 2 and the light-receiving region 101 is 500 µm or more.

Next, a method for manufacturing the electronic component 100 will be described in the order of processes (processes a to f).

Process a: The electronic device 1, the opposite member 2, and the fixing member 3 are prepared.

Process b: The electronic device 1 is fixed to the fixing member 3 with the bonding member 5. The bonding member 5 can be die bonding paste, such as epoxy resin and silicone resin, or die bonding tape.

Process c: An adhesive 40 containing a liquid composition 41, which is a precursor of the light-cured resin 43, and a large number of inorganic particles 42, which are solid dispersed in the liquid composition 41, are prepared. The liquid composition 41 typically contains prepolymer, which is the main component of the light-cured resin 43, monomer (reaction diluent) for adjusting the viscosity, and a photopolymerization initiator. The liquid composition 41 may further optionally contain additives, such as a thermal polymerization initiator, an adhesion imparting agent, a thixotropic agent, a leveling agent, an antifoaming agent, and a filler. For radial polymerization, examples of available prepolymer include functional acrylate, epoxy acrylate, urethane acrylate, polyester acrylate, copolymer acrylate, polybutadiene acrylate, silicon acrylate, and amino resin acrylate. For cation polymerization, epoxy resin, vinyl ether, oxetane, vinyl ether, or the like can be used as prepolymer.

In the particle-diameter distribution of the inorganic particles 42 by volume, $D_{50}$ is 0.5 µm or more (Condition (a) $D_{50} \geq 0.5$ µm), where $D_{50}$ is a particle diameter having a cumulative value of distribution of 50%. In the particle-diameter distribution of the inorganic particles 42 by volume, $D_{90}$ is 5.0 µm or less (Condition (b) $D_{90} \leq 5.0$ µm), where $D_{90}$ is a particle diameter having a cumulative value of distribution of 90%. In the particle-diameter distribution of the inorganic particles 42 by volume, it may be the case that $D_{10}$ is 0.5 µm or more (Condition (e) $D_{10} \geq 0.5$ µm), where $D_{10}$ is a particle diameter having a cumulative value of distribution of 10%. It may also be the case that $D_{50}$ is 0.9 µm or more and 1.8 µm or less (Condition (f) $0.9$ µm $\leq D_{10} \leq 1.8$ µm). According to one aspect, $D_{90}$ is 1.8 µm or more (Condition (g) $D_{90} \geq 1.8$ µm). In the particle-diameter distribution of the inorganic particles 42 by volume, it may also be the case that $D_{3\delta}$ is 10 µm or less (Condition (h) $D_{3\delta} \leq 10$ µm), where $D_{3\delta}$ is a particle diameter having a cumulative value of distribution of 99.7%. In the particle-diameter distribution of the inorganic particles 42 by volume, it may be the case that $D_{MAX}$ is 15 µm or less (Condition (i) $D_{MAX} \leq 15$ µm), where $D_{MAX}$ is a particle diameter having a cumulative value of distribution of 100%.

The particle diameter of the inorganic particles 42 are sphere equivalent diameters that are given using a laser diffraction method defined in Japanese Industrial Standard, JIS Z8825-1. The particle diameters of the inorganic particles 42 in the adhesive 40 can be measured in advance before mixed with the liquid composition 41. Furthermore, by measuring the optical characteristics of the liquid composition 41 in advance, the particle diameters of the inorganic particles 42 can be measured, with the inorganic particles 42 dispersed in the liquid composition 41. The particle diameters of the inorganic particles 42 can also be measured by separating the liquid composition 41 and the inorganic particles 42 and then dispersing the inorganic particles 42 into an appropriate medium whose optical characteristics are known.

Process d: The adhesive 40 is applied to at least one of the opposite member 2 and the fixing member 3. In this example, the adhesive 40 is applied to the fixing member 3, as shown in FIG. 2A. A known application method, such as a dispenser method and a printing method, can be employed. Typically, the adhesive 40 is applied in a frame shape so that the electronic component 100 constitutes an airtight container. An extremely high proportion of inorganic particles 42 in the adhesive 40 increases the viscosity of the adhesive 40, which makes it difficult to apply. Therefore, the content of the inorganic particles 42 is set to 25 wt % or less of the whole quantity of the adhesive 40, such as to 20 wt % or less. If the inorganic particles 42 are flakes, the viscosity of the adhesive 40 extremely increases with an increase in content of the inorganic particles 42, and thus, according to one aspect the content of the inorganic particles may be set to 42 to 20 wt % or less. An extremely low viscosity of the adhesive 40 makes it difficult to control the thickness of the adhesive 40. According to one aspect, the viscosity of the adhesive 40 is 5 Pa·s or higher and 50 Pa·s or lower.

Process e: As shown in FIG. 2B, the opposite member 2 and the fixing member 3 are bonded together with the adhesive 40. Thus, the opposite member 2 comes into contact with the adhesive 40, the fixing member 3 comes into contact with the adhesive 40, and the adhesive 40 is located between the opposite member 2 and the fixing member 3. Let T' be the thickness of the adhesive 40 at that time. The opposite member 2 is disposed apart from the fixing member 3 by a distance corresponding to the thickness T' of the adhesive 40. At that time, the ratio of $D_{90}$ to T', $D_{90}/T'$, is 0.4 or less (Condition (c') $D_{90}/T' \leq 0.4$). Although the thickness T of the adhering member 4 is 5 µm or more and 40 µm or less, as described above, the thickness T' of the adhesive 40 is controlled to this range after being hardened by appropriately determining the amount of adhesive 40 applied and the pressure conditions of the opposite member 2 to the fixing member 3.

Process f: As shown in FIG. 2C, the adhesive 40 is exposed to light via the opposite member 2 in this state to be hardened. The wavelength of the exposure light is 0.5 µm or less, typically, 0.2 µm or more and 0.4 µm or less. According to one aspect, the amount of exposure light is 4,000 mJ/cm² or more. The exposure time may be less than ten minutes, typically, one second or more and less than five minutes. Decreasing the exposure time can prevent generation of bubbles in the light-cured resin 43. The light exposure causes the liquid composition 41 in the adhesive 40 to harden to form the solid light-cured resin 43. The liquid composition 41 of the adhesive 40 may further have a thermosetting property, in which case, typically, a thermosetting process for heating the adhesive 40 is performed after the light-curing process (light exposure). The temperature at the thermosetting process is typically 100° C. or higher. By putting the electronic component 100 into a furnace, the temperatures of the opposite member 2, the space 21, and the fixing member 3 also become 100° C. or higher. At the time of the light-curing process, the liquid composition 41 may be in a half-cured state. Thus, the inorganic particles 42 dispersed in the liquid composition 41 are fixed as the inorganic particles 44 dispersed in the solid light-cured resin 43 by the light-curing process or the light-curing process and the thermosetting process, and hence the adhering member 4 shown in FIG. 2D is obtained. The inorganic particles 42 in the adhesive 40 have the effect of preventing cure-shrinkage of the liquid composition 41 when the liquid composition 41 hardens. The inorganic particles 44 in the adhering member 4 have the effect of reducing the thermal expansion of the light-cured resin 43 in the cured adhering member 4. Therefore, an extremely small percentage of the inorganic particles 42 in the adhesive 40 makes it difficult to give a practical stress reducing effect. Therefore, according to one aspect the amount of the inorganic particles is set to 42 to 5 wt % or more of the whole amount of the adhesive 40.

The thickness T of the adhering member 4 obtained by the curing process is typically smaller than the thickness T' of the adhesive 40 because of shrinkage due to polymerization. Generally, the cure-shrinkage of light-cured resin is 10% or lower at the maximum, mostly, 5% or lower. Accordingly, setting the thickness T' of the adhesive 40 to 6 μm or more and 40 μm or less (Condition (d') 6 μm≤T'≤40 μm) allows the thickness T of the adhering member 4 to be 5 μm or more and 40 μm or less.

There seems to be no substantial difference in particle-diameter distribution between the inorganic particles 42 in the adhesive 40 and the inorganic particles 44 in the adhering member 4 before and after the curing process. However, for example, if the opposite member 2 is strongly pushed against the fixing member 3 after the adhesive 40 is applied, the inorganic particles 42 in the adhesive 40 may be broken, and thus, the particle-diameter distribution could be changed. In particular, if the thickness T' of the adhesive 40 is smaller than the maximum particle diameter $D_{MAX}$ of the inorganic particles 42, there is a high possibility that the inorganic particles 42 may be crushed and broken. Since smaller particle diameters of the inorganic particles 42 may provide improved spot delamination prevention than larger diameters, the breakage does not have a significant influence on the occurrence of spot delamination. But, breakage of the inorganic particles 42 is reduced as much as possible from the perspective of a controllability of particle diameters of the inorganic particles 42. Therefore, it may be the case that the thickness T' of the adhesive 40 is larger than the maximum particle diameter $D_{MAX}$ of the inorganic particles 42.

Second to sixth embodiments will be described as other embodiments of the electronic component 100. In the following embodiments, components having the similar functions are given the same reference signs as those described in the first embodiment, and detailed descriptions will be omitted. The adhering member 4 used in the second to sixth embodiments satisfies at least conditions (a) to (d) described in the first embodiment.

Figure 3A:
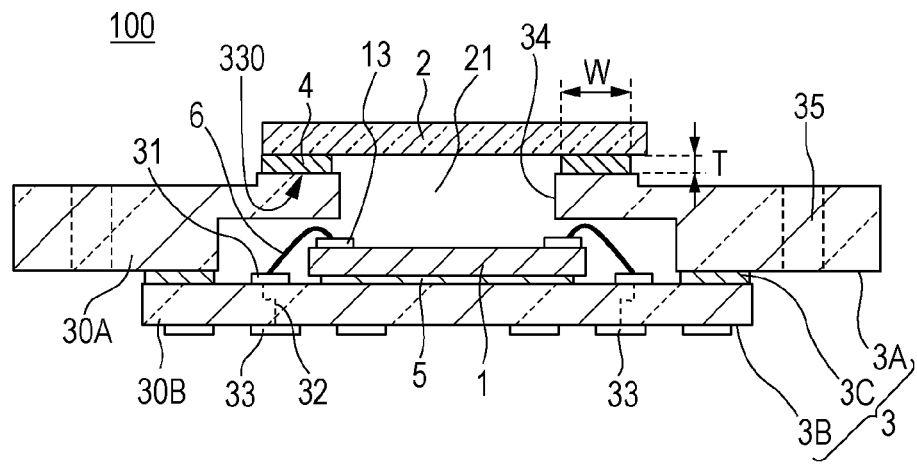
FIG. 3A is a schematic cross-sectional view of an example of an electronic component according to a second embodiment.

Referring to FIG. 3A, an example of the electronic component 100 according to the second embodiment will be described. FIG. 3A is a schematic cross-sectional view of the electronic component 100 taken along line III-III in FIG. 1A, and a schematic plan view thereof is omitted. The electronic component 100 includes the electronic device 1, the opposite member 2, and the fixing member 3. The fixing member 3 and the opposite member 2 are bonded together with the adhering member 4. The configuration of the adhering member 4 is the same as that in the first embodiment. The electronic component 100 of the second embodiment differs from the first embodiment in the configuration of the fixing member 3. Therefore, only differences from the first embodiment will be described.

Although the fixing member 3 of the first embodiment is constituted by the single substrate 30, the fixing member 3 of this example includes a first fixing member 3A constituted by a first substrate 30A and a second fixing member 3B constituted by a second substrate 30B. The first fixing member 3A and the second fixing member 3B are joined to each other with a joint portion 3C. The materials of the first substrate 30A and the material for the second substrate 30B may either differ or be the same. The opposite member 2 is bonded to the first fixing member 3A with the adhering member 4. The electronic device 1 is bonded to the second fixing member 3B with the bonding member 5. The first fixing member 3A is a frame-shaped plate having an opening 34. The opening 34 serves as the space 21 for the electronic device 1. The first fixing member 3A has through holes 35. The through holes 35 can be used for positioning when the electronic component 100 is mounted to an electronic module and also for screwing. The second fixing member 3B is provided with the plurality of inner terminals 31 on one surface thereof, and the external terminals 33 connected from the inner terminals 31 via the inner wires 32 on the other surface. At least part of the plurality of external terminals 33 are provided in the regions of orthogonal projection from the electronic device 1 and the opposite member 2.

There are several manufacturing methods for the electronic component 100, which are roughly divided into the following two methods (Method I and Method II). Method I is a method of exposing the adhesive 40 to light to form the adhering member 4, with the electronic device 1 and the opposite member 2 opposed. Method II is a method of exposing the adhesive 40 to light to form the adhering member 4, with the electronic device 1 and the opposite member 2 not opposed, and thereafter opposing the electronic device 1 and the opposite member 2 to each other.

Method I can be further divided into two methods, Method I-1 and Method I-2. Method I-1 is a method of joining the first fixing member 3A and the second fixing member 3B together with the joint portion 3C to manufacture the fixing member 3 and thereafter bonding the electronic device 1 to the second fixing member 3B with the bonding member 5. With Method I-1, the processes after the first fixing member 3A and the second fixing member 3B are joined together are the same as in the first embodiment. Method I-2 is a method of bonding the electronic device 1 to the second fixing member 3B with the bonding member 5 and thereafter joining the first fixing member 3A and the second fixing member 3B with the joint portion 3C to manufacture the fixing member 3. In this example, the opening 34 of the first fixing member 3A is smaller than the outline of the electronic device 1, and the first fixing member 3A covers the electrodes 13 of the electronic device 1, the inner terminals 31 of the second fixing member 3B, and the connecting members 6. Therefore, Method I-2 of bonding the electronic device 1 to the second fixing member 3B with the bonding member 5 and providing the connecting members 6 and thereafter manufacturing the fixing member 3 may be employed. With Method I, the opposite member 2 opposed to the electronic device 1 is bonded to the fixing member 3 (first fixing member 3A) with the adhesive 40, with the electronic device 1 bonded to the fixing member 3 in which the first fixing member 3A and the second fixing member 3B are joined.

With Method II, the opposite member 2 is bonded to the first fixing member 3A with the adhesive 40 so that the opposite member 2 covers the opening 34. The electronic device 1 is bonded to an appropriate position of the second fixing member 3B with the bonding member 5, and the electronic device 1 and the inner terminals 31 are connected together with the connecting members 6. In this stage, either the adhesion of the opposite member 2 and the first fixing member 3A or the bonding of the electronic device 1 and the second fixing member 3B may be performed first. At the next stage, the first fixing member 3A bonded to the opposite member 2 and the second fixing member 3B bonded to the electronic device 1 are joined together with the joint portion 3C such that the opposite member 2 opposes the electronic device 1.

Figure 3B:
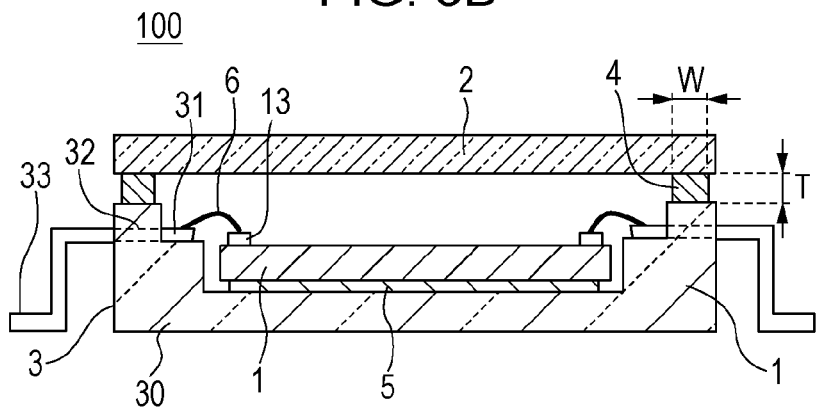
FIG. 3B is a schematic cross-sectional view of an example of an electronic component according to a third embodiment.

Referring to FIG. 3B, an example of the electronic component 100 according to the third embodiment will be described. FIG. 3B is a schematic cross-sectional view of the electronic component 100 taken along line III-III in FIG. 1A, and a schematic plan view thereof is omitted. The electronic component 100 includes the electronic device 1, the opposite member 2, and the fixing member 3. The fixing member 3 and the opposite member 2 are bonded together with the adhering member 4. The configuration of the adhering member 4 is the same as that in the first embodiment. The electronic component 100 of the third embodiment differs from the first embodiment in the configuration of the fixing member 3. Therefore, only differences from the first embodiment will be described.

In this embodiment, the external terminals 33 are located outside the regions of orthogonal projection from the electronic device 1 and the opposite member 2. In this example, the inner terminals 31, the inner wires 32, and the external terminals 33 are constituted by lead frames, and the external terminals 33 are gull-wing shaped.

Figure 3C:
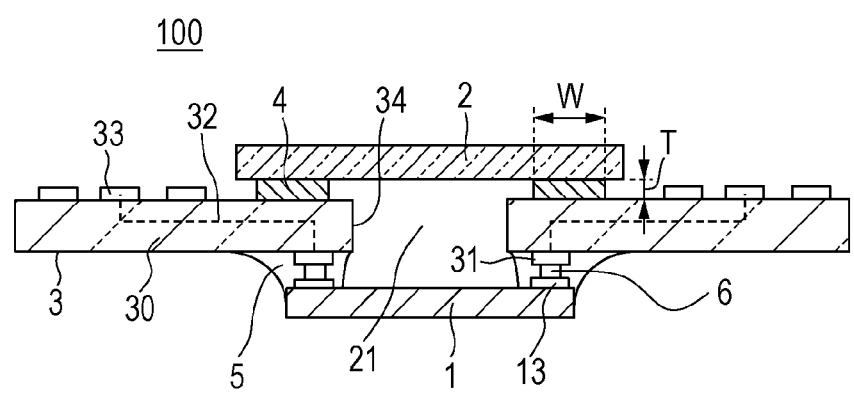
FIG. 3C is a schematic cross-sectional view of an example of an electronic component according to a fourth embodiment.

Referring to FIG. 3C, an example of the electronic component 100 according to the fourth embodiment will be described. FIG. 3C is a schematic cross-sectional view of the electronic component 100 taken along line III-III in FIG. 1A, and a schematic plan view thereof is omitted. The electronic component 100 includes the electronic device 1, the opposite member 2, and the fixing member 3. The fixing member 3 and the opposite member 2 are bonded together with the adhering member 4. The configuration of the adhering member 4 is the same as that in the first embodiment. The electronic component 100 of the fourth embodiment differs from the first embodiment in the configuration of the fixing member 3. Therefore, only differences from the first embodiment will be described.

Although the first embodiment is configured such that the electronic device 1 is located between the fixing member 3 and the opposite member 2, this embodiment is configured such that the electronic device 1 is not located between the fixing member 3 and the opposite member 2, and the fixing member 3 is located between the electronic device 1 and the opposite member 2. The opposite member 2 is bonded to one surface of the fixing member 3 with the adhering member 4, and the electronic device 1 is bonded to the other surface of the fixing member 3 with the bonding member 5. Thus, the electronic device 1 and the opposite member 2 are fixed to each other with the fixing member 3. In this example, the bonding member 5 seals the electrodes 13 of the electronic device 1, the inner terminals 31 of the fixing member 3, and the connecting members 6 that electrically connect them. The external terminals 33 of the fixing member 3 are connected to the inner terminals 31 via the inner wires 32 and are located outside the region of orthogonal projection from the electronic device 1.

Figure 4A:
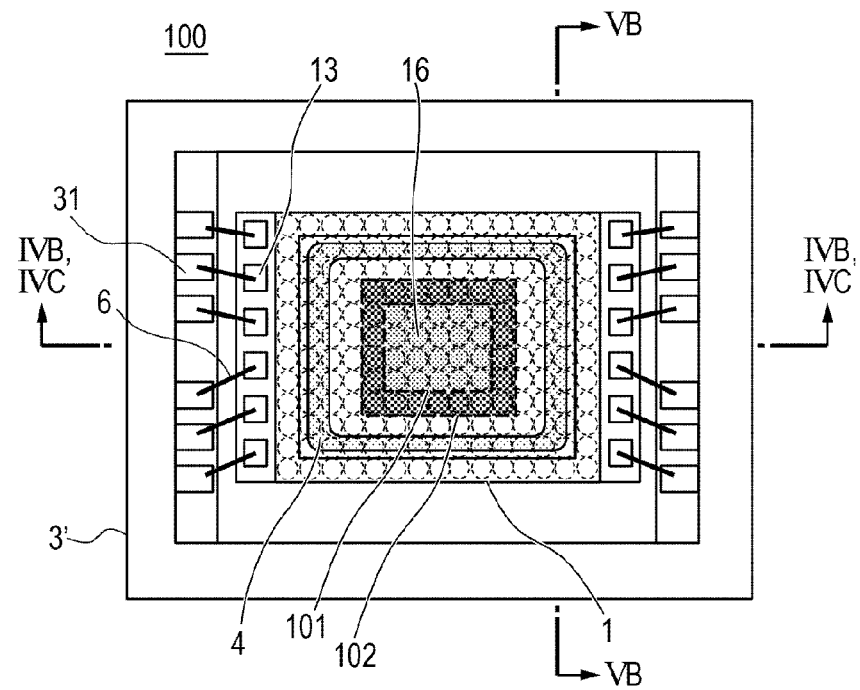
FIG. 4A is a schematic plan view of a first example of an electronic component according to a fifth embodiment.
Figure 4B:
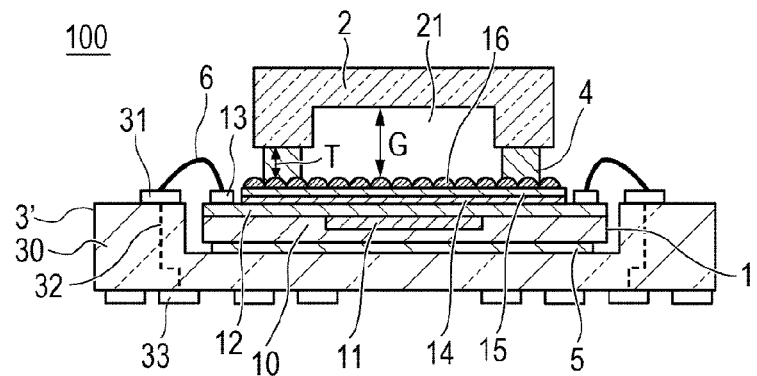
FIG. 4B is a schematic cross-sectional view of the first example of the electronic component according to the fifth embodiment.
Figure 4C:
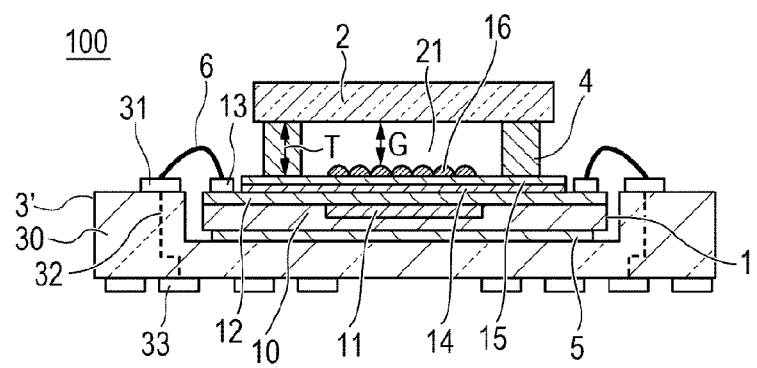
FIG. 4C is a schematic cross-sectional view of a second example of the electronic component according to the fifth embodiment.

Referring to FIGS. 4A and 4B, a first example of the electronic component 100 according to the fifth embodiment will be described. FIG. 4A is a schematic plan view of the electronic component 100 of the first example, and FIG. 4B is a schematic cross-sectional view of the electronic component 100 taken along line IVB-IVB in FIG. 4A. Referring to FIG. 4C, a second example of the electronic component 100 according to the fifth embodiment will be described. FIG. 4C is a schematic cross-sectional view of the electronic component 100 taken along line IVC-IVC in FIG. 4A, and a schematic plan view thereof is omitted. The electronic components 100 of the first and second examples include the electronic device 1, the opposite member 2, and a supporting member 3'.

Commonalties between the first example and the second example will be described. The opposite member 2 of this embodiment is bonded directly to the electronic device 1 with the adhering member 4, and thus, the electronic device 1 and the opposite member 2 are fixed to each other. The electronic device 1 is bonded to the supporting member 3' with the bonding member 5. The supporting member 3' includes the substrate 30, the inner terminals 31, the inner wires 32, and the external terminals 33. The electrodes 13 of the electronic device 1 are connected to the inner terminals 31 with the connecting members 6. At least part of the plurality of external terminals 33 are provide in the regions of orthogonal projection from the electronic device 1 and the opposite member 2.

Next, differences between the first example and the second example will be described. The first example and the second example differ in the shape of the adhering surface of the electronic device 1 to the adhering member 4. In the first example, the adhering surface of the electronic device 1 to the adhering member 4 is constituted by a microlens layer and has an irregular surface due to the shape of the microlenses. In contrast, in the second example, the adhering surface of the electronic device 1 to the adhering member 4 is smooth due to a smooth layer (not shown). In both the first example and the second example, the adhering surface of the opposite member 2 to the adhering member 4 is smooth. Since the adhering surface of the electronic device 1 to the adhering member 4 is rougher than the adhering surface of the opposite member 2 to the adhering member 4, as in the first example, the adhesion between the electronic device 1 and the opposite member 2 is stronger than that in the second example because of the reason described in the first embodiment.

The first example and the second example differ in the shape of the opposite member 2. In the first example, the adhering surface of the opposite member 2 to the adhering member 4 projects, so that the lower surface of the opposite member 2 is recessed. In contrast, the lower surface of the opposite member 2 in the second example is flat. The configuration of the first example allows the distance G between the light-receiving region 101 and the opposite member 2 to be larger than the thickness T of the adhering member 4. In contrast, in the second example, the distance G between the light-receiving region 101 and the opposite member 2 is smaller than the thickness T of the adhering member 4 by a distance corresponding to the thickness of the microlens layer 16. Even if the adhering surface of the electronic device 1 to the adhering member 4 is constituted by the microlens layer 16, as in the first example, the shape of the opposite member 2, as in the second example, causes the distance G between the light-receiving region 101 and the opposite member 2 to be equal to the thickness T of the adhering member 4.

As described above, if the electronic device 1 is a photoelectric conversion element, according to one aspect the distance G between the opposite member 2 and the light-receiving region 101 may be set to be 200 µm or more. On the other hand, the thickness T of the adhering member 4 may need to be 40 µm or less to prevent spot delamination, and thus, the distance G has to be set to 40 µm or less in the second example. However, in the first example, the distance G can be set to be larger than the thickness T. Accordingly, in the case where the electronic device 1 is a photoelectric conversion element, the first example is more suitable than the second example.

In the first to fourth embodiments, the electronic device 1 and the fixing member 3 constitute a unit that provides electrical functions as part of the electronic component 100. Likewise, in the fifth embodiment, the electronic device 1 and the fixing member 3' constitute a unit that provides electrical functions as part of the electronic component 100. The first to fourth embodiments and the fifth embodiment differ in that whether the opposite member 2 is bonded to the fixing member 3 or the electronic device 1 but are the same in that the opposite member 2 opposing the electronic device 1 is bonded to the unit.

Figure 5A:
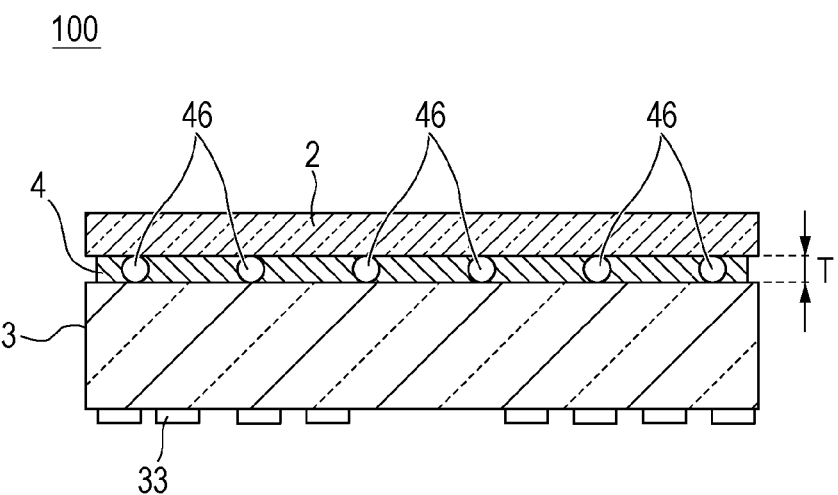
FIG. 5A is a schematic cross-sectional view of a first example of an electronic component according to a sixth embodiment.
Figure 5B:
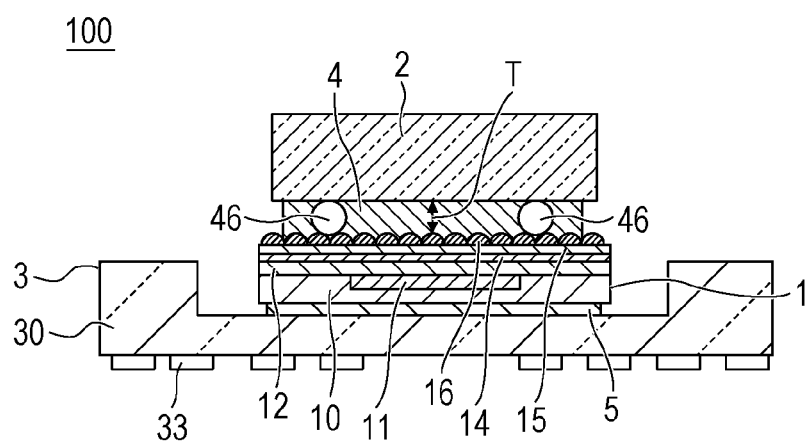
FIG. 5B is a schematic cross-sectional view of a second example of the electronic component according to the sixth embodiment.

Referring to FIG. 5A, a first example of the electronic component 100 according to the sixth embodiment will be described. FIG. 5A is a schematic cross-sectional view of the electronic component 100 taken along line VA-VA in FIG. 1A. Referring to FIG. 5B, a second example of the electronic component 100 according to the sixth embodiment will be described. FIG. 5B is a schematic cross-sectional view taken along line VB-VB in FIG. 4A.

The first example of the sixth embodiment can be applied to the first to fourth embodiments. As shown in FIG. 5A, thickness defining members 46 that define the thickness T of the adhering member 4 are provided between the opposite member 2 and the fixing member 3. The thickness defining members 46 define the thickness T of the cured adhering member 4 by serving as spacers that define the space between the opposite member 2 and the fixing member 3, with the adhesive 40 interposed between the opposite member 2 and the fixing member 3. Therefore, the thickness defining members 46 are in contact with both of the adhering surface of the opposite member 2 to the adhering member 4 and the adhering surface of the fixing member 3 to the adhering member 4. Since the thickness T' of the adhesive 40 and the thickness T of the adhering member 4 need to be controlled to prevent the spot delamination, the thickness defining members 46 may be provided. Examples of the thickness defining members 46 include organic spacers, such as polystyrene spacers, and inorganic spacers, such as silica spacers. To define the thicknesses T and T', a material having a high elastic modulus that resists deformation even if the opposite member 2 is pushed against the fixing member 3 may be used to define the thicknesses T and T', and thus, inorganic spacers may be used. The elastic modulus of the thickness defining members 46 may be higher than the elastic modulus of the light-cured resin 43. Furthermore, the thickness defining members 46 may have a spherical shape to define the adhering member 4 to a predetermined thickness even if any orientation the thickness defining members 46 are disposed in. Since the thickness T of the adhering member 4 may be 10 µm or more and 30 µm or less according to aspects of the invention, the diameter of the spherical thickness defining members 46 may be 10 µm or more and 30 µm or less, such as 15 µm or more and 25 µm or less.

The thickness defining members 46 may be in contact with the light-cured resin 43 of the adhering member 4. This prevents the thickness defining members 46 from dropping-off. Since the thickness defining members 46 are in contact with the opposite member 2 and the fixing member 3 when the adhering member 4 is formed, the inorganic particles 44 dispersed in the light-cured resin 43 and the thickness defining members 46 can be clearly distinguished from each other. The thickness defining members 46 can either be disposed in advance before the adhesive 40 is applied or be mixed in the adhesive 40 after the adhesive 40 is applied. The thickness defining members 46 may be added in advance to the adhesive 40 to be applied. According to one aspect, the amount of the thickness defining members 46 to be added may be about 0.005 to 2 wt % of the total amount of the adhesive 40. The inorganic particles 44 and the thickness defining members 46 are different members for different purposes, as described above. Therefore, even if the adhesive 40 contains the thickness defining members 46, the thickness defining members 46 in the adhesive 40 do not contribute to the particle-diameter distribution of the inorganic particles 42. Measurements of the particle-diameter distribution of the thickness defining members 46 and the inorganic particles 42 in the adhesive 40 containing the thickness defining members 46 sometimes show a peak indicating the presence of the thickness defining members 46 in the range of the particle diameter larger than 5.0 µm. Excluding particle diameters (of thickness defining members 46) corresponding to the peak from the particle-diameter distribution allows an accurate particle-diameter distribution of the inorganic particles 42 to be obtained.

The second example of the sixth embodiment can be applied to the fifth embodiment. As shown in FIG. 5B, the thickness defining members 46 that define the thickness T of the adhering member 4 are provided between the opposite member 2 and the electronic device 1. The thickness defining members 46 define the thickness T of the cured adhering member 4 by serving as spacers that define the space between the opposite member 2 and the electronic device 1, with the adhesive 40 interposed between the opposite member 2 and the electronic device 1. Therefore, the thickness defining members 46 are in contact with both of the adhering surface of the opposite member 2 to the adhering member 4 and the adhering surface of the electronic device 1 to the adhering member 4. Since the other features are the same as those of the first example, descriptions thereof will be omitted.

Figure 6:
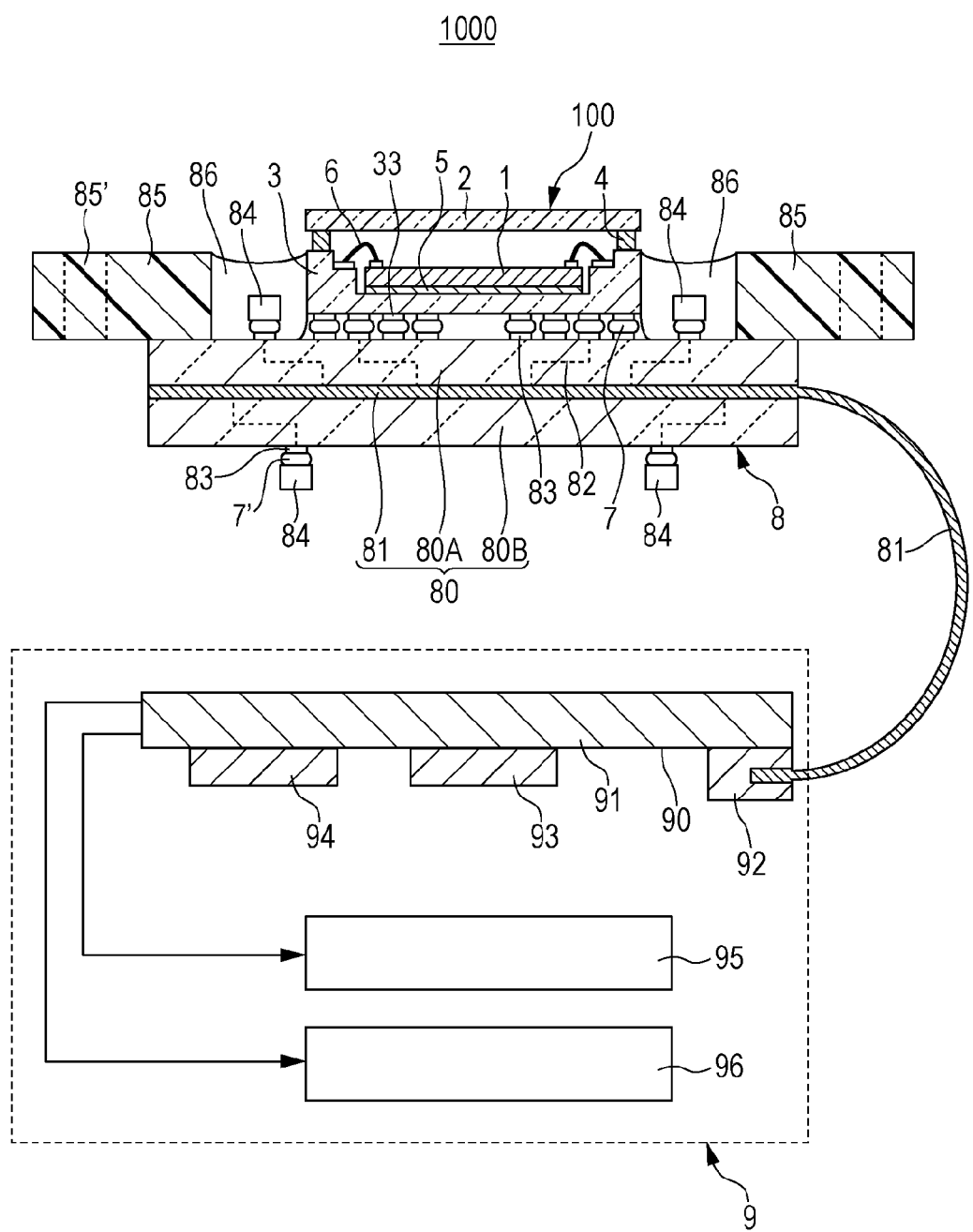
FIG. 6 is a schematic diagram of an example of an electronic module according to a seventh embodiment.

Referring to FIG. 6, an example of an electronic module 1000 according to a seventh embodiment will be described. The electronic module 1000 includes at least the electronic component 100 and a circuit member 8. In this example, the electronic component 100 described in the first embodiment will be described.

The circuit member 8 includes a circuit board 80 and a plurality of connection terminals 83 provided on the circuit board 80. The circuit board 80 can be a rigid substrate composed of glass epoxy, a flexible substrate composed of polyimide, or a rigid flexible substrate. In this example, the circuit board 80 is a rigid flexible substrate including a first rigid substrate 80A, a second rigid substrate 80B, and a flexible substrate 81 sandwiched between the first rigid substrate 80A and the second rigid substrate 80B. The circuit board 80 is provided with wires 82 formed by printing. Part of the wires 82 can be used as the connection terminals 83. Some of the connection terminals 83 of the circuit member 8 and the external terminals 33 of the electronic component 100 are electrically and mechanically connected together by the electrically conducting members 7. The electrically conducting members 7 are typically formed of solder that firmly fixes the external terminals 33 to the connection terminals 83 but may be formed an anisotropic conductive material (ACM).

The circuit member 8 of this example includes, on the circuit board 80, passive components 84, such as resistors and capacitors, connected to the wires 82. The other connection terminals 83 of the circuit member 8 and the passive components 84 are electrically and mechanically connected together by electrically conducting members 7'. The electrically conducting members 7' may either be formed of the material of the electrically conducting members 7 or be formed of a different material. For example, the melting point of solder used as the electrically conducting members 7 may be lower than the melting point of solder used as the electrically conducting members 7'.

A mounting member 85 formed of metal, plastic, or the like for mounting the circuit member 8 to the frame of the electronic module 1000 is firmly fixed to the circuit member 8 with a fastening member 86 formed of ultraviolet curing resin, thermosetting resin, or the like. The mounting member 85 of this example has through holes 85'. The through holes 85' are used as screw holes or fitting holes for mounting the circuit member 8 to the frame. The fastening member 86 is in contact with the fixing member 3 of the electronic component 100 to reinforce the mechanical connection of the electronic component 100 to the circuit member 8. The fastening member 86 covers the passive components 84 of the circuit member 8 to seal them. In the electronic component 100 of the second embodiment, the first fixing member 3A of the fixing member 3 can also serve as the mounting member 85 of this example. Likewise, the fixing member 3 of the first embodiment can also serve as the mounting member 85 of this example. For example, the fixing member 3 of the first embodiment may also be formed such that a metal plate having a through hole, such as the mounting member 85, is embedded in the plastic or ceramic substrate 30. In the electronic component 100 of the fourth embodiment, the fixing member 3 may also serve as the circuit member 8 of this embodiment.

The electronic module 1000 may include peripherals 9 connected to the circuit member 8. The peripherals 9 include peripheral circuits 90, such as a control circuit 93 for generating a control signal input to the electronic device 1 to control the electronic device 1 and an information processing circuit 94 for generating an information signal on the basis of a signal output from the electronic device 1. A connector 92, the control circuit 93, and the information processing circuit 94 are disposed on a printed wiring board 91. In this example, since the flexible substrate 81 of the circuit member 8 is connected to the connector 92 of the peripheral circuits 90, the circuit member 8 is connected to the peripheral circuits 90. The control circuit 93 and the information processing circuit 94 may be integrated to a single semiconductor chip. The control circuit 93 and the information processing circuit 94 may be disposed on the circuit board 80 of the circuit member 8.

In the case where the electronic device 1 is an image pickup device, the information signal is an image signal. The control circuit 93 and the information processing circuit 94 may either be mounted, as one or a plurality of IC chips, on the circuit member 8, like the electronic component 100, or be mounted on another circuit member connected to the circuit member 8. The peripherals 9 may also include a recording unit 95, such as a semiconductor memory, for recording the information signal generated by the information processing circuit 94 and a display unit 96, such as a liquid crystal display and an organic EL display, for displaying information based on the information signal generated by the image processing circuit 94.

Next, a method for manufacturing the electronic module 1000 will be described in the order of processes (processes g to j).

Process g: The electronic component 100 in which the electronic device 1 and the opposite member 2 are fixed to the fixing member 3 and the circuit member 8 are prepared. The electronic component 100 may be that manufactured in the foregoing processes a to f. The passive components 84 of the circuit member 8 are firmly fixed to the circuit board 80 with the electrically conducting members 7' by reflow soldering or the like.

Process h: Soldering paste is applied to at least one of the connection terminals 83 of the circuit member 8 and the external terminals 33 of the electronic component 100. The electronic component 100 and the circuit member 8 are bonded together with the soldering paste so that the soldering paste is located between the connection terminals 83 and the external terminals 33. The fixing member 3 and the circuit member 8 bonded are put into a furnace to heat the soldering paste. That is, the external terminals 33 and the connection terminals 83 are connected by reflow soldering. The temperature in the furnace during the reflow soldering is typically 100° C. or higher, so that the temperatures of the opposite member 2, the space 21, and the fixing member 3 becomes 100° C. or higher. This allows the external terminals 33 and the connection terminals 83 to be electrically and mechanically connected by the electrically conducting members 7 (solder), and the electronic component 100 to be firmly fixed and mounted onto the circuit member 8. The heating temperature at that time is set to be lower than the melting point of the electrically conducting members 7' to prevent dropping-off of the passive components 84, which are firmly fixed to the circuit board 80 in advance. In this example, the electronic component 100 has an LGA structure. If it has the BGA structure, solder balls can be used as the electrically conducting members 7, and the electronic component 100 can be similarly firmly fixed to the circuit member 8 by reflow soldering.

Process i: The mounting member 85 is placed on the circuit member 8, to which a thermosetting or light-curable adhesive is applied and hardened, to form the fastening member 86. In the manufacturing of the electronic module 1000, the section including at least the electronic component 100 and the circuit member 8 may be treated as an assembly, namely an electronic module such as a camera module or a display module. The mounting member 85 may be included in the electronic module.

Process j: The mounting member 85 is mounted to the frame (chassis), and the circuit member 8 is connected to the peripherals 9.

Thus, the electronic module 1000 described with reference to FIG. 6 can be manufactured.

When the electronic component 100 described in the fourth embodiment is to be mounted on the electronic module 1000, the external terminals 33 can be individually connected by soldering to the connection terminals 83 of the circuit member 8 by hand or the like. Thus, a surface-mount structure can be achieved. Another example is that the external terminals 33 are not gull-wing shaped but L-shaped and are inserted into through holes of the circuit member 8 and are collectively connected to the connection terminals 83 by soldering or reflow soldering. Thus, an insertion-mount structure can be achieved.

EXAMPLES

Figure 7:
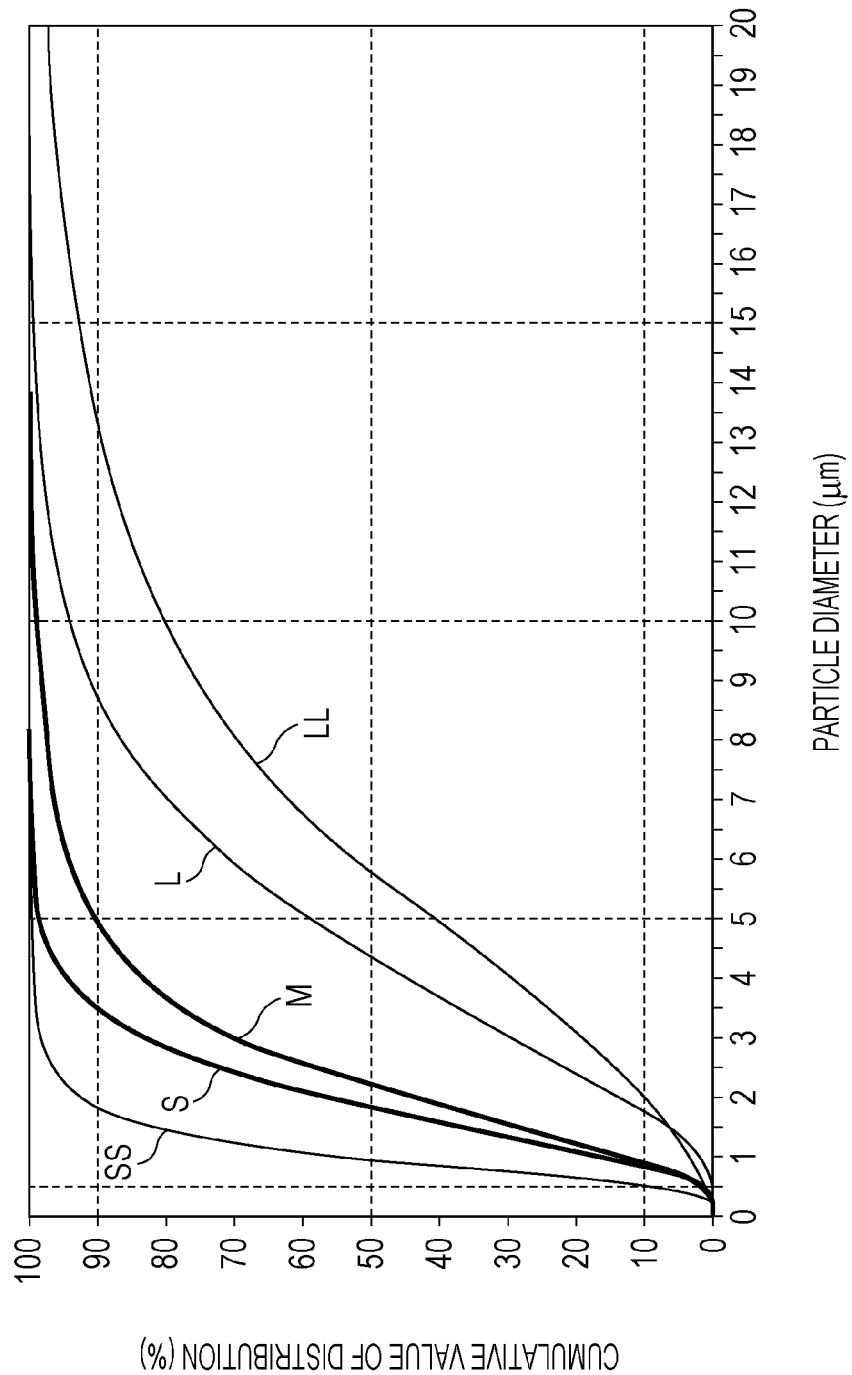
FIG. 7 is a graph for explaining the particle-diameter distribution of examples.

For the inorganic particles 42 of the adhesive 40 and the inorganic particles 44 of the adhering member 4, five patterns, SS, S, M, L, and LL shown in FIG. 7, of particle-diameter distribution will be examined. FIG. 7 shows the cumulative values of distribution of the individual particle diameters of the five patterns, SS, S, M, L, and LL. Table 1 shows an example of typical values of the particle diameters of the individual cumulative values of distribution for distributions SS, S, M, L, and LL. The distributions SS, S, and M are set so that the maximum particle diameter $D_{MAX}$ does not exceed 15 µm, and thus, there is no inorganic particle whose diameter exceeds 15 µm in any evaluation regions. For this examination, samples 1 to 25 in which the particle-diameter distribution and the content of the inorganic particles 44 differ in the range of 5 to 25% are used as the adhesive 40. Epoxy prepolymer was used as the liquid composition 41 of the adhesive 40, and talc flakes are used as the inorganic particles 42 of the adhesive 40. The process of curing the adhesive 40 includes a photo-curing process using ultraviolet rays and thereafter a thermosetting process of maintaining the temperature at 120° C. or hither for two hours or more, with the peak temperature at 160° C. Then, for the electronic component 100 of the first embodiment in which the opposite member 2 is bonded to the fixing member 3 with the adhesive 40, the adhering member 4 after being subjected to a heating process similar to Process h was evaluated in terms of the amount of spot delamination. This example employs a heating condition that, after the adhering member 4 is formed, the electronic component 100 is put into a furnace and is heated such that the opposite member 2 is maintained at 150° C. or higher for 20 seconds or more, with the peak temperature at 190°. The opposite member 2 of this example is a flat square plate made of borosilicate glass, in which one side of the outer periphery of the lower surface 220 has a length of 14.5 mm and which has a thickness of 0.5 mm. The fixing member 3 of this example has a ceramic substrate 30 and has the external terminals 33 with an LGA-structure. The upper surface 330 of the fixing member 3 is a square whose one side has a length of 15.0 mm. The width W of the adhering member 4 was set to about 500 µm, $P_V=P_H=13.0$ mm, and distance G was set to 500 µm. The area S1 of the contact surface of the lower surface 220 of the opposite member 2 with the space 21 was about 169 mm², and the area S4 of the adhering surface of the lower surface 220 of the opposite member 2 with the adhering member 4 was about 27 mm². As a result, the area S1 is five times or more as large as the area S4.

Table 2 shows the evaluation results of spot delamination for samples 1 to 25. The thickness T of the adhering member 4 in Table 2 is the thickness of the adhering member 4 in a W×W square region, serving as an evaluation region, of several electronic components 100 in which the amount of the adhesive 40 applied is changed. The adhering member 4 varies in thickness across the periphery thereof, and the thickness T of the adhering member 4 also includes values in a plurality of regions to be evaluated. The use of the spacers, as in the sixth embodiment, allows variations in the thickness T of the adhering member 4 to be reduced. Evaluation "E" in Table 2 shows a case where no spot delamination is observed in the evaluation region, and evaluation "G" shows a case where spot delamination is observed in the evaluation region but is not ubiquitously distributed. Evaluation "A" shows a case where there is spot delamination ubiquitously distributed in the evaluation region, and the degree thereof is slightly low, and evaluation "P" shows a case where there is spot delamination ubiquitously distributed in the evaluation region, and the degree thereof is extremely high. Evaluation "E" and evaluation "G" show that spot delamination is prevented or reduced. Evaluation D shows that area delamination has occurred, and evaluation—shows that no evaluation result is obtained, which includes a case where it is difficult to form the adhering member 4 because the adhesive 40 could not be applied or the like and a case where no examination was performed.

"Spot delamination" will be described in detail.

Figure 8A:
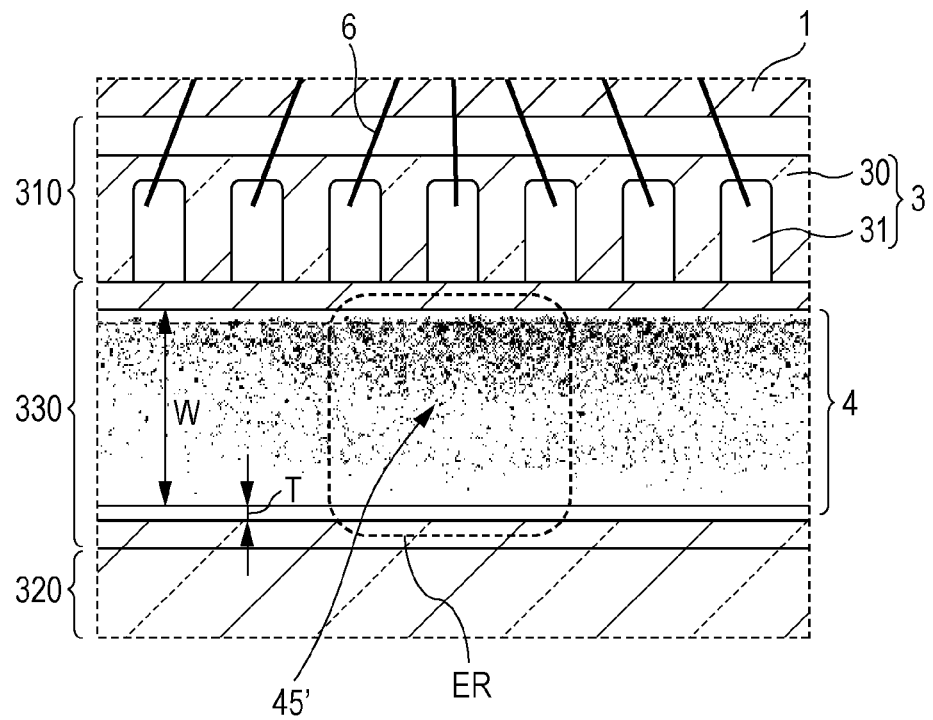
FIGS. 8A and 8B are schematic diagrams for explaining spot delamination.
Figure 8B:
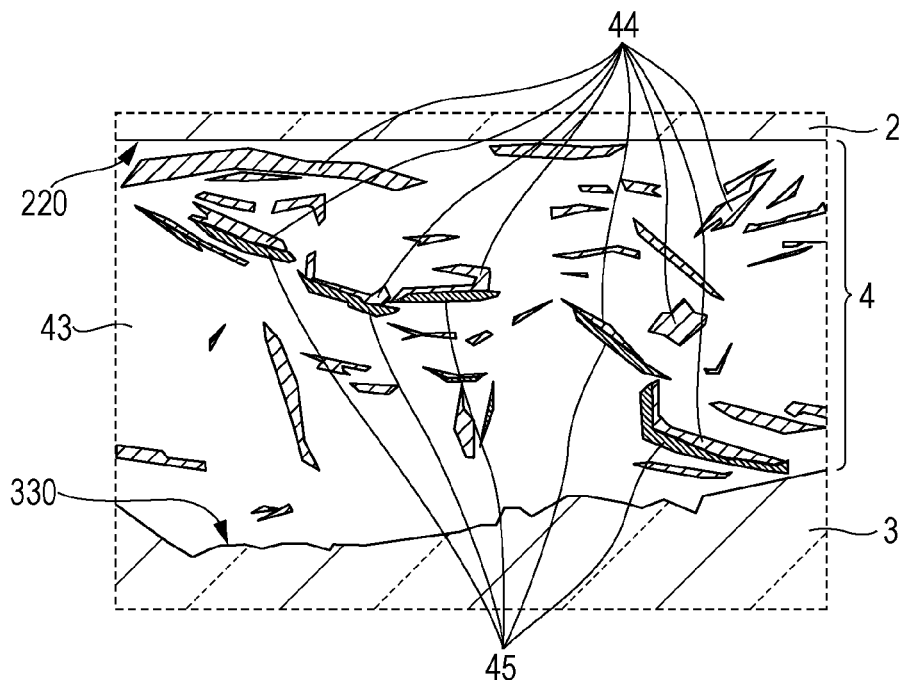

FIG. 8A is a schematic diagram illustrating the adhering member 4 containing the inorganic particles 44 in the patterns of distribution L and distribution LL observed via the opposite member 2 with an optical microscope from the direction of arrow F in FIGS. 1A and 1B. FIG. 8B illustrates a cross section of the adhering member 4 observed with an electron microscope. In FIGS. 8A and 8B, components the same as or similar to those in FIGS. 1A to 2D are given the same reference signs, and detailed descriptions thereof will be omitted.

As shown in FIG. 8A, a large number of white spots 45' (in FIG. 8A, the white spots 45' are expressed as black spots for the purpose of convenience) in the transparent adhering member 4. In FIG. 8A, an evaluation region ER is divided substantially equally into three portions, that is, a first portion, a second portion, and a third portion, from the inner periphery side (from above in the drawing) in the widthwise direction of the adhering member 4. In the first portion, the white spots 45' are densely, ubiquitously distributed. Since the evaluation region ER includes such a portion, the evaluation of the evaluation region ER shown in FIG. 8A is "P". The white spots 45' are not densely but ubiquitously distributed in the second portion. In the case where the degree of distribution of the white spots 45' in the evaluation region ER is not as in the first portion but is as in the second portion, the evaluation of the evaluation region ER is "A". In the third portion, the white spots 45' are not ubiquitously distributed but are scattered. In the case where the degree of distribution of the white spots 45' in the evaluation region ER is not as in the first and second portions but as in the third portion, the evaluation of the evaluation region ER is "G". In the example of FIG. 8A, although the white spots 45' as in the first portion are unevenly distributed in the inner surface 310 side (space 21 side) with respect to an intermediate position of the adhering member 4 in the widthwise direction, the white spots 45' are sometimes densely distributed evenly over the entire evaluation region ER.

As shown in FIG. 8B, the gaps 45 are present between the light-cured resin 43 and the inorganic particles 44 at the locations corresponding to the white spots 45'. The white spots 45' seem to be visualized by the reflection of visual light at the interface between the gaps 45 and the light-cured resin 43 and/or the inorganic particles 44. The gaps 45 are not likely to be present before the adhering member 4 is formed, that is, from the time when the liquid composition 41 is present around the inorganic particles 42 in the adhesive 40. Accordingly, the gaps 45 seem to be generated after the liquid composition 41 gels or is solidified, and it is appropriate to think that the gaps 45 are generated because the light-cured resin 43 is separated from the inorganic particles 44 at least after the adhesive 40 is subjected to the light-curing process. FIG. 8B shows that most of the gaps 45 are generated not at the upper surface side of the inorganic particles 44 (adjacent to the opposite member 2) but at the lower surface side of the inorganic particles 44 (adjacent to the fixing member 3). This seems to be caused by the exposure of the adhesive 40 to light via the opposite member 2, as described in Process e. The exposure light that has passed through the opposite member 2 and the liquid composition 41 is incident on the upper surfaces of the inorganic particles 44. Since the inorganic particles 44 are typically made of a material whose exposure light transmittance is lower than that of the liquid composition 41, the exposure light is difficult to reach the liquid composition 41 that is present in the vicinity of the lower surfaces of the inorganic particles 44. Even if the inorganic particles 44 are not made of a material whose exposure light transmittance is lower than that of the liquid composition 41, the exposure light is difficult to reach the liquid composition 41 that is present in the vicinity of the lower surfaces of the inorganic particles 44 because of the reflection (including scattering) of the exposure light on the upper surfaces of the inorganic particles 44, refraction of the exposure light in the inorganic particles 44, and so on. Therefore, the liquid composition 41 that is present in the vicinity of the lower surfaces of the inorganic particles 44 seems to be less exposed to light than the liquid composition 41 that is present in the other portion. After the exposure, the adhesion between the lower surfaces of the inorganic particles 44 and the light-cured resin 43 becomes lower than that between the upper surfaces of the inorganic particles 44 and the light-cured resin 43. This may be a potential cause of the spot delamination. Such a low-adhesion portion is hereinafter referred to as "latent spot delamination".

Even if it is difficult to observe spot delamination directly after the light-curing process, spot delamination is sometimes overt through a post process, as described with reference to FIG. 8B. The state in which the gaps 45 are generated between the light-cured resin 43 and the inorganic particles 44, as described with reference to FIG. 8B, is hereinafter referred to as "overt spot delamination".

The overt spot delamination seems to be generated when vertically reverse forces are applied to latent spot delamination. That is, an upward force (toward the opposite member 2) from the lower surfaces of the inorganic particles 44 and a downward force (toward the fixing member 3 or the electronic device 1) from the lower surfaces of the inorganic particles 44 are applied to the adhering member 4. These forces peel off weak-adhesion portions, so that the latent spot delamination shifts to overt spot delamination.

If the area S4 of the adhering surface of the lower surface 220 of the opposite member 2 to the adhering member 4 is smaller than the area S1 of the contact surface (a portion inside the adhering surface) of the lower surface 220 of the opposite member 2 to the space 21, an upward force applied to the opposite member 2 tends to concentrate onto the adhering member 4. This seems to cause spot delamination to be overt.

There are several possible factors that may cause this force. The result of our examination shows that the overt spot delamination tends to occur particularly when air in the space 21 (airtight space) expands with heat in the case where the adhering member 4 has a frame shape, and the opposite member 2, the fixing member 3, and the adhering member 4 define an airtight container. As shown in FIG. 8A, this can be understood also from the fact that the spot delamination is conspicuous in the portion of the adhering member 4 closer to the space 21 in the widthwise direction thereof. According to Boyle-Charles' law, the pressure in the space 21 whose volume is constant is proportional to the absolute temperature of the space 21. This thermal expansion occurs when the electronic component 100 is heated after the light-curing process and is conspicuous particularly when a heating process involving heating (increasing the temperature) of the opposite member 2 in contact with the space 21 is performed. For example, during the manual soldering for connecting the electronic component 100 of the third embodiment to the circuit member 8, the external terminals 33 are locally heated, and the opposite member 2 is little heated. In contrast, during the reflow soldering for connecting the electronic component 100 of the first embodiment to the circuit member 8, not only the external terminals 33 but also the opposite member 2 are heated when the electronic component 100 is put into a reflow furnace, so that the space 21 is also heated to the same degree of temperature as that of the opposite member 2. Therefore, the thermal expansion of the space 21 reveals the spot delamination. If the temperature in the space 21 becomes higher than that of the space 21 at the time when the opposite member 2 is bonded to the fixing member 3, the space 21 can be expanded with heat to reveal the spot delamination. However, because a force exceeding the weak adhesive force of the latent spot delamination may need to be applied to shift from the latent spot delamination to the overt spot delamination, there may be some criticality depending on the kind of the liquid composition 41. Actually, spot delamination seems to be overt with an increase in the pressure in the space 21 when heating is performed so that the opposite member 2 reaches 100° C. or higher.

Among the heating processes to be performed after the light-curing process, described above, examples include heating performed when the electronic component 100 is firmly fixed to the circuit member 8 by reflow soldering during the thermosetting process for the adhering member 4 and heating performed when a heat-curable adhesive is subjected to a thermosetting process to form the fastening member 86. Among the heating processes performed after the light-curing process, particularly, a heating process in which the temperature in the space 21 becomes the highest tends to cause overt spot delamination, and the temperature becomes the highest typically during reflow soldering. Assuming that the space 21 is a complete airtight space whose volume does not change, the inner pressure of the space 21 becomes 127% of that at 20° C. During reflow soldering, the inner pressure of the space 21 becomes 158% of that at 20° C. due to an increase in temperature from 20° C. to 190° C.

Since the thermosetting process after the light-curing process can harden a portion that is insufficiently exposed to light during the light-curing process, spot delamination seems to be prevented. However, it should be understood that spot delamination has occurred even if the thermosetting process is performed for a sufficiently longer time than for the light-curing process. This may be because a portion that is not hardened by the light-curing process is not sufficiently hardened also by the thermosetting process because of the difference in the mechanism of polymerization between the light-curing and the thermosetting. Even if the thermosetting process can compensate for the insufficient light-curing, a considerably longer time than normal several hours of the thermosetting process is required, and thus, it is apparent that the production efficiency drops.

The vertically reverse forces applied to the latent spot delamination are not caused only by the thermal expansion of the space 21. Another example is a stress generated in the adhering member 4 due to the difference in thermal expansion between the opposite member 2 and the fixing member during the heating or cooling of the electronic component 100 in the manufacturing process. Another example is a stress generated in the adhering member 4 caused by the thermal expansion of the opposite member 2 and the fixing member 3 due to heat generated in the electronic device 1 while the electronic module 1000 is in use and due to changes in environmental temperature. An external force to the electronic component 100 may also be a cause of overt spot delamination.

From a close examination in the foregoing point of view, the inventors have found that there is a correlation between the particle diameters of the inorganic particles 44 and the thickness T of the adhering member 4 and generation of latent spot delamination.

TABLE 1

| CUMULATIVE VALUE OF DISTRIBUTION SIGN | 10% $D_{10}$ | 50% $D_{50}$ | 90% $D_{90}$ | 95% $D_{2\delta}$ | 99.70% $D_{3\delta}$ | 100% $D_{MAX}$ |
|---|---|---|---|---|---|---|
| DISTRIBUTION SS | 0.5 μm | 0.9 μm | 1.8 μm | 2.2 μm | 3.9 μm | 7.7 μm |
| DISTRIBUTION S | 0.8 μm | 1.8 μm | 3.5 μm | 4.1 μm | 5.6 μm | 8.1 μm |
| DISTRIBUTION M | 0.9 μm | 2.2 μm | 5.0 μm | 6.4 μm | 10 μm | 14 μm |
| DISTRIBUTION L | 1.7 μm | 4.3 μm | 8.7 μm | 10 μm | 16 μm | 20 μm |
| DISTRIBUTION LL | 2.0 μm | 5.8 μm | 13 μm | 17 μm | 33 μm | 48 μm |

TABLE 2

| SAMPLE | DISTRIBUTION | INORGANIC PARTICLE CONTENT | THICKNESS T OF ADHERING MEMBER (μm) | | | | | | | | | | | |
|---|---|---|---|---|---|---|---|---|---|---|---|---|---|---|
| | | | 2 | 5 | 10 | 15 | 20 | 25 | 30 | 35 | 40 | 50 | 60 | 80 |
| 1 | SS | 5% | D | E | E | E | E | E | E | E | E | E | A | A |
| 2 | SS | 10% | D | E | E | E | E | E | E | E | E | E | A | P |
| 3 | SS | 15% | D | E | E | E | E | E | E | E | E | E | P | P |
| 4 | SS | 20% | D | E | E | E | E | E | E | E | E | A | P | P |
| 5 | SS | 25% | — | — | E | E | E | E | E | E | E | A | P | P |
| 6 | S | 5% | D | D | E | E | E | E | E | E | E | E | A | P |
| 7 | S | 10% | D | A | E | E | E | E | E | E | E | E | P | P |
| 8 | S | 15% | D | A | E | E | E | E | E | E | E | A | P | P |
| 9 | S | 20% | D | A | E | E | E | E | E | E | E | A | P | P |
| 10 | S | 25% | — | — | — | E | E | E | E | E | E | A | P | P |
| 11 | M | 5% | — | D | A | E | E | E | E | E | E | G | P | P |
| 12 | M | 10% | — | A | A | E | E | E | E | E | E | G | P | P |
| 13 | M | 15% | — | A | A | E | E | E | E | E | G | A | P | P |
| 14 | M | 20% | — | A | A | E | E | E | E | G | G | A | P | P |
| 15 | M | 25% | — | — | — | — | — | G | G | G | G | A | P | P |
| 16 | L | 5% | — | P | P | A | A | A | G | G | G | A | P | P |
| 17 | L | 10% | — | P | P | A | A | A | A | G | A | A | P | P |
| 18 | L | 15% | — | P | P | P | A | A | A | A | A | A | P | P |
| 19 | L | 20% | — | P | P | P | P | A | A | A | A | A | P | P |
| 20 | L | 25% | — | — | — | — | — | — | — | — | — | A | P | D |
| 21 | LL | 5% | — | — | P | P | P | P | P | A | A | P | P | P |
| 22 | LL | 10% | — | — | P | P | P | P | P | A | A | P | P | P |
| 23 | LL | 15% | — | — | P | P | P | P | P | A | A | P | P | D |
| 24 | LL | 20% | — | — | P | P | P | P | P | A | A | P | D | D |
| 25 | LL | 25% | — | — | — | — | — | — | — | — | — | — | — | — |

The results in Table 2 show that spot delamination is remarkably reduced in the distributions SS, S, and M in which the inorganic particles 42 whose particle diameters are 5.0 μm or less constitute 90% or more. In contrast, spot delamination is conspicuous in the distributions L and LL in which the number of the inorganic particles 42 whose particle diameters are 5.0 μm or more is larger than that in the distribution M. This shows that Mie scattering in which the influence of geometric blocking of the exposure light by the inorganic particles 42 is small seems to predominantly occur in the inorganic particles 42 whose particle diameters are 5.0 μm or less. Thus, when the inorganic particles 42 whose particle diameters are 5.0 μm or less constitute 90% or more of the whole, that is, when Condition (b) is satisfied, the latent spot delamination seems to be prevented.

The examination results in Table 2 will be analyzed. The behavior of light radiated on particles generally depends on the wavelength of the light and the particle diameters. If the particle diameters are sufficiently smaller than the wavelength of the light, Rayleigh scattering occurs. If the particle diameters are substantially the same as the wavelength of the light, Mie scattering occurs. If the particle diameters are sufficiently larger than the wavelength of the light, geometrical approximation occurs. Since exposure light for use in the light-curing process for the liquid composition 41 is 0.5 μm or less, Mie scattering or geometrical approximation will be occur for the inorganic particles 42 having a particle diameter of 0.5 μm or more in the adhesive 40. Thus, when the inorganic particles 42 having a particle diameter larger than the wavelength of the exposure light constitute 50% or more of all of the inorganic particles 42, that is, Condition (a) is satisfied, the latent spot delamination seems to be prevented. Particularly, it may be the case that the inorganic particles 42 whose particle diameters are larger than the wavelength of the exposure light, as in distributions SS, S, and M, constitute 90% or more of all of the inorganic particles 42, that is, Condition (e) be satisfied.

Since the elastic modulus of the light-cured resin 43 in the typical adhering member 4 is smaller than the elastic modulus of the inorganic particles 44, a force applied to the lower surfaces of the inorganic particles 44 due to deformation of the light-cured resin 43 can be absorbed. According to Hook's law, absorption of the force applied to the lower surfaces of the inorganic particles 44 seems to be proportional to the thickness of the light-cured resin 43 (the thickness T of the adhering member 4). Therefore, generation of latent spot delamination can be reduced by increasing the thickness T of the adhering member 4. The right side of the thick line in Table 2 is the range of Condition (c), $D_{90}/T \geq 0.4$, in which the light-cured resin 43 can be given appropriate elasticity, and hence generation of overt spot delamination seems to be prevented.

In a disperse system, such as the adhesive 40 containing the inorganic particles 44, since the inorganic particles 44 are generally evenly dispersed in the liquid composition 41, a plurality of inorganic particles 44 are present on the normal to the lower surface 220 of the opposite member 2. A typical traveling direction of exposure light is parallel to the normal to the lower surface 220 of the opposite member 2. Therefore, if the plurality of inorganic particles 44 are present in the traveling direction of the exposure light, latent spot delamination tends to occur at the inorganic particles 44 closer to the fixing member 3. The particle diameter of the inorganic particles 44 is a factor that defines the area of the lower surfaces thereof. Therefore, latent spot delamination tends to occur at the lower surfaces of the inorganic particles 44 whose particle diameters are large. Furthermore, latent spot delamination tends to occur in the vicinity of the inorganic particles 44 close to the fixing member 3 as compared with the inorganic particles 44 close to the opposite member 2.

Reducing the number of inorganic particles 44 present on the normal to the lower surface 220 of the opposite member 2 as much as possible can prevent generation of latent spot delamination. Since the adhesive 40 is exposed to light via the opposite member 2, the exposure light travels in the direction of the thickness of the adhering member 4. That is, reducing the thickness T of the adhering member 4 seems to be able to reduce the occurrence of latent spot delamination. Table 2 shows that, of evaluation regions that satisfy conditions (a), (b), and (c), overt spot delamination is reduced in the evaluation regions in which the thickness T of the adhering member 4 is 5 μm or more and 40 μm or less. Thus, spot delamination can be prevented by satisfying Condition (e).

Decreasing the content of the inorganic particles 42 can also decrease the number of the inorganic particles 44 present on the normal to the lower surface 220 of the opposite member 2. Satisfying the foregoing conditions (a) to (d) in the range of the content of the inorganic particles 42, 5% to 25% can reduce generation of spot delamination. In Sample 10 and Sample 15, the viscosity of the adhesive 40 is extremely higher than that of Sample 9 and Sample 14, and thus, the adhesive 40 cannot sometimes be applied at a small thickness T'. Thus, the content of the inorganic particles 42 in the adhesive 40 may be 5% or more and 20% or less.

In distributions SS and S, evaluation "G" is not given in the range in which conditions (a) to (d) are satisfied. In distribution M, evaluation "G" is given to samples in which the content of the inorganic particles 44 is relatively high and samples in which the thickness T is relatively large. This seems to be caused by the fact that distribution M contains more inorganic particles 44 whose particle diameters exceed 5.0 μm than distributions SS and S. This indicates that aspects of the invention may provide that the inorganic particles 44 whose particle diameters exceed 5.0 μm are minimized. In distribution L, evaluation "G" is given even if the content is as small as 5%. In distribution L, particle diameter $D_{2\delta}$ having a cumulative value of distribution of 95%, which corresponds to twice as large as the standard deviation of the particle-diameter distribution, is 10 μm. Meanwhile, in distribution M, particle diameter $D_{3\delta}$ having a cumulative value of distribution of 99.7%, which corresponds to three times as large as the standard deviation of the particle-diameter distribution, is 10 μm. Thus, setting the particle diameter $D_{3\delta}$ having a cumulative value of distribution of 99.7% to 10 μm or less, that is, satisfying Condition (h), reduces the influence of the inorganic particles 44 whose particle diameters exceed 5.0 μm, if present.

In distributions SS and S, spot delamination is suitably reduced in the range of the thickness T of the adhering member 4, 5 μm or more and 40 μm or less, as compared with distribution M. Referring to FIG. 7, even in the distribution between the lines indicating distribution SS and distribution S, spot delamination can be suitably reduced. Thus, aspects of the invention may satisfy Condition (f) and Condition (g).

The part of the light-cured resin 43 closer to the fixing member 3 is less hardened than the part closer to the opposite member 2. Therefore, area delamination tends to occur on the adhering surface of the fixing member 3 to the adhering member 4 as compared with the adhering surface of the opposite member 2 to the adhering member 4. However, making the upper surface 330 of the fixing member 3, which is the adhering surface to the adhering member 4, rougher than the lower surface 220 of the opposite member 2, which is the adhering surface to the adhering member 4 can increase the area of the adhering surface of the opposite member 2 to the adhering member 4, thus improving the adhesion of the opposite member 2 and the adhering member 4.

As described above, the embodiments relate to an electronic component in which the adhering member for bonding the opposite member and the fixing member, or the opposite member and the electronic device, is composed of light-cured resin and inorganic particles. By suitably setting the thickness of the adhering member and the particle diameters of the inorganic particles, spot delamination that may occur in the adhering member can be prevented.

The above description is merely examples, and it is to be understood that various modifications may be made without departing from the scope of the claims and the technical spirit described in the specification.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-216774 filed Sep. 30, 2011, which is hereby incorporated by reference herein in its entirety.

What is claimed is:

1. An electronic component comprising:
a unit including an electronic device; and
an opposite member opposing the electronic device,
wherein the unit and the opposite member are bonded together with an adhering member disposed between the unit and the opposite member, the adhering member having light-cured resin and inorganic particles dispersed in the light-cured resin; and
wherein in a particle-diameter distribution of the inorganic particles by volume, the following conditions (a), (b), (c) and (d) are satisfied:

$$D_{50} \geq 0.5 \text{ μm} \tag{a}$$

$$D_{90} \leq 5.0 \text{ μm} \tag{b}$$

$$D_{90}/T \leq 0.4 \tag{c}$$

$$5 \text{ μm} \leq T \leq 40 \text{ μm} \tag{d}$$

where $D_{50}$ is a particle diameter having a cumulative value of distribution of 50%, $D_{90}$ is a particle diameter having a cumulative value of distribution of 90%, and T is the thickness of the adhering member.

2. The electronic component according to claim 1, wherein the unit includes a fixing member having a depression accommodating the electronic device; and
the adhering member bonds the opposite member and the fixing member together.

3. The electronic component according to claim 1, wherein in the particle-diameter distribution, at least any of the following conditions (e), (f), (g), (h), and (i) is satisfied:

$$D_{10} \geq 0.5 \text{ μm} \tag{e}$$

$$0.9 \text{ μm} \leq D_{50} \leq 1.8 \text{ μm} \tag{f}$$

$1.8\ \mu m \leq D_{90} \leq 3.5\ \mu m$ (g)

$D_{3\delta} \leq 10\ \mu m$ (h)

$D_{MAX} \leq 15\ \mu m$ (i)

where $D_{10}$ is a particle diameter having a cumulative value of distribution of 10%, $D_{3\delta}$ is a particle diameter having a cumulative value of distribution of 99.7%, and $D_{MAX}$ is a particle diameter having a cumulative value of distribution of 100%.

4. The electronic component according to claim 1, wherein the inorganic particles have a flake shape.

5. The electronic component according to claim 1, wherein the content of the inorganic particles in the adhering member is 5 wt % or more and 20 wt % or less.

6. The electronic component according to claim 1, wherein the adhering surface of the unit to the adhering member is rougher than the adhering surface of the opposite member to the adhering member.

7. The electronic component according to claim 1, wherein a spacer is disposed between the opposite member and the unit.

8. The electronic component according to claim 1, wherein
the adhering member encloses a space between the electronic device and the opposite member;
the width of the adhering member is larger than the thickness of the adhering member; and
the area of the contact surface of the opposite member with the space is larger than the area of the adhering surface of the opposite member to the adhering member.

9. The electronic component according to claim 1, wherein
the electronic device is a photoelectric conversion element; and
the distance between a light-receiving region of the electronic device and the opposite member is 200 µm or more.

10. The electronic component according to claim 1, wherein the unit includes a plurality of external terminals that are individually electrically connected to the electronic device.

11. An electronic module comprising:
the electronic component according to claim 10;
a circuit member including connection terminals; and
a peripheral device connected to the circuit member,
wherein the external terminals and the connection terminals are electrically and mechanically connected together.

12. The electronic module according to claim 11, wherein the plurality of external terminals are provided at least in the region of orthogonal projection from at least one of the electronic device and the opposite member.

13. A method for manufacturing an electronic module, comprising the step of electrically and mechanically connecting the external terminals of the electronic component according to claim 10 to connection terminals of a circuit member by reflow soldering.

14. A method for manufacturing an electronic component including an electronic device and an opposite member opposing the electronic device, the method comprising:
interposing an adhesive containing a light-curable liquid composition and inorganic particles dispersed in the liquid composition (1) between at least part of a fixing member for fixing the electronic device and the opposite member to each other and the opposite member or (2) between the electronic device and the opposite member; and
forming an adhering member by curing the adhesive with an exposure of the adhesive to light via the opposite member, wherein
in a particle-diameter distribution of the inorganic particles by volume, the following conditions (a), (b), (c), and (d) are satisfied:

$D_{50} \geq 0.5\ \mu m$ (a)

$D_{90} \leq 5.0\ \mu m$ (b)

$D_{90}/T \leq 0.4$ (c)

$5\ \mu m \leq T \leq 40\ \mu m$ (d)

where $D_{50}$ is a particle diameter having a cumulative value of distribution of 50%, $D_{90}$ is a particle diameter having a cumulative value of distribution of 90%, and T is the thickness of the adhering member.

15. The method for manufacturing an electronic component, according to claim 14, wherein in the particle-diameter distribution, at least any of the following conditions (e), (f), (g), (h), and (i) is satisfied:

$D_{10} \geq 0.5\ \mu m$ (e)

$0.9\ \mu m \leq D_{50} \leq 1.8\ \mu m$ (f)

$1.8\ \mu m \leq D_{90} \leq 3.5\ \mu m$ (g)

$D_{3\delta} \leq 10\ \mu m$ (h)

$D_{MAX} \leq 15\ \mu m$ (i)

where $D_{10}$ is a particle diameter having a cumulative value of distribution of 10%, $D_{3\delta}$ is a particle diameter having a cumulative value of distribution of 99.7%, and $D_{MAX}$ is a particle diameter having a cumulative value of distribution of 100%.

16. The method for manufacturing an electronic component, according to claim 14, wherein the content of the inorganic particles in the adhesive is 5 wt % or more and 20 wt % or less.

17. The method for manufacturing an electronic component, according to claim 14, the inorganic particles have a flake shape, and the adhesive has a viscosity of 5 Pa·s or more and 50 Pa·s or less.

18. The method for manufacturing an electronic component, according to claim 14, wherein the wavelength of the exposure light is 0.5 µm or less, the amount of exposure light is 4,000 mJ/cm² or more, and the exposure time is less than ten minutes.

19. The method for manufacturing an electronic component, according to claim 14, wherein
the adhesive has a frame shape; and
after the exposure, the opposite member is heated to 100° C. or higher, with the electronic device and the opposite member opposed.

20. A method for manufacturing an electronic module comprising: installing an electronic component manufactured by the method according to claim 14 to a circuit member by reflow soldering, wherein
after the opposite member is heated to a first temperature after the exposure and before the reflow soldering, the opposite member is heated to a second temperature higher than the first temperature by the reflow soldering.

* * * * *